(12) United States Patent
Galton et al.

(10) Patent No.: US 8,542,138 B2
(45) Date of Patent: Sep. 24, 2013

(54) RING OSCILLATOR DELTA SIGMA ADC MODULATOR WITH REPLICA PATH NONLINEARITY CALIBRATION

(75) Inventors: Ian Galton, Del Mar, CA (US); Gerry Taylor, Laguna Niguel, CA (US)

(73) Assignee: The Regents of the University of California, Oakland, CA (US)

( * ) Notice: Subject to any disclaimer, the term of this patent is extended or adjusted under 35 U.S.C. 154(b) by 63 days.

(21) Appl. No.: 13/359,701

(22) Filed: Jan. 27, 2012

(65) Prior Publication Data

US 2012/0194369 A1   Aug. 2, 2012

Related U.S. Application Data

(60) Provisional application No. 61/437,297, filed on Jan. 28, 2011.

(51) Int. Cl.
*H03M 3/02*   (2006.01)

(52) U.S. Cl.
USPC .......................................... 341/118; 342/143

(58) Field of Classification Search
USPC ...................... 341/111, 115, 118–120, 143
See application file for complete search history.

(56) References Cited

U.S. PATENT DOCUMENTS

| | | | |
|---|---|---|---|
| 6,700,520 B1 * | 3/2004 | Miller | 341/143 |
| 7,602,323 B2 | 10/2009 | Galton et al. | |
| 8,063,810 B2 * | 11/2011 | Guenther | 341/157 |
| 8,400,341 B2 * | 3/2013 | Su | 341/157 |
| 2012/0112936 A1 * | 5/2012 | Huang | 341/110 |
| 2012/0154192 A1 * | 6/2012 | Op 'T Eynde | 341/155 |

OTHER PUBLICATIONS

Adams, R., et. al. "A 113dB SNR Oversampling DAC with Segmented Noise-Shaped Scrambling," *IEEE International Solid-State Circuits Conference*, pp. 62-63, 413, Feb. 1998.

Boser, B., et. al. "Simulating and Testing Oversampled Analog-to-Digital Converters", IEEE Transactions on Computer Aided Design, vol. 7, No. 6, pp. 668-674, Jun. 1988.

Dhanasekaran et al., "A 20mHz Bw 68dB DR CT ΔΣ ADC Based on a Multi-Bit Time-Domain Quantizer and Feedback Element," *IEEE International Solid-State Circuits Conference*, pp. 174-175, Feb. 2009.

Galton, et. al., "A 130 mW 100 MS/s Pipelined ADC with 69 dB SNDR Enabled by Digital Harmonic Distortion Correction," *IEEE Journal of Solid-State Circuits*, vol. 44, No. 12, pp. 3314-3328, Dec. 2009.

Galton, et. al., "Digital Background Correction of Harmonic Distortion in Pipelined ADCs," *Circuits and Systems-I: Regular Papers, IEEE Transactions on*, vol. 53, No. 9, pp. 1885-1895, Sep. 2006.

(Continued)

*Primary Examiner* — Howard Williams
(74) *Attorney, Agent, or Firm* — Greer, Burns & Crain Ltd.

(57) ABSTRACT

An embodiment provides a continuous-time delta-sigma modulator for analog-to-digital conversion. The modulator includes a signal path generating including a ring voltage controlled oscillator driven by an analog input signal. The signal path produces digital values by sampling the ring voltage controlled oscillator. A calibration circuit measures nonlinear distortion coefficients in a replica of the signal path. A nonlinearity corrector corrects the digital values based upon determined nonlinear distortion coefficients. Preferred embodiment ADC ΔΣ modulators do not require any analog integrators, feedback DACs, comparators, or reference voltages, and do not require a low jitter clock.

17 Claims, 15 Drawing Sheets

(56) References Cited

OTHER PUBLICATIONS

Galton, et. al., "A Mostly Digital Variable-Rate Continuous-Time ADC ΔΣ Modulator," *IEEE International Solid-State Circuits Conference*, pp. 298-299, Feb. 2010.

Hovin et al., "Delta-Sigma Modulators Using Frequency-Modulated Intermediate Values," *IEEE Journal of Solid-State Circuits*, vol. 32, No. 1, pp. 13-22, Jan. 1997.

Iwata et al., "The Architecture of Delta Sigma Analog-to-Digital Converters Using a Voltage-Controlled Oscillator as a Multibit Quantizer," *IEEE Transactions on Circuits and Systems-II: Analog and Digital Signal Processing*, vol. 46, No. 7, pp. 941-945, Jul. 1999.

Kim et al, "A Time-Based Analog-to-Digital Converter Using a Multi-Phase Voltage-Controlled Oscillator," *IEEE International Symposium on Circuits and Systems*, pp. 3934-3937, May 2006.

Mittergger et al., "A 20-mW 640-MHz CMOS Continuous-Time ΔΣ ADC With 20-MHz Signal Bandwidth, 80-dB Dynamic Range and 12-bit ENOB," *IEEE Journal of Solid-State Circuits*, vol. 41, No. 12, pp. 2641-2649, Dec. 2006.

Naiknaware et al, "Time-Referenced Single-Path Multi-Bit ΔΣ ADC using a VCO-Based Quantizer," *IEEE Transactions on Circuits and Systems-II: Analog and Digital Signal Processing*, vol. 47, No. 7, pp. 596-602, Jul. 2000.

Opteynde, "A Maximally-Digital Radio Receiver Front-End," *IEEE International Solid-State Circuits Conference*, pp. 450-451, Feb. 2010.

Park et al, "A 0.13 µm CMOS 78dB SNDR 87mW 20MHz BW CT ΔΣ ADC with VCO-Based Integrator and Quantizer," *IEEE International Solid-State Circuits Conference*, pp. 170-171, Feb. 2009.

Straayer et al, "A 12-Bit, 10-MHz Bandwidth, Continuous-Time ΣΔ ADC With a 5-Bit, 950-MS/s VCO-Based Quantizer," *IEEE Journal of Solid-State Circuits*, vol. 43, No. 4, Apr. 2008.

Sripad, et. al., "A Necessary and Sufficient Condition for Quantization Errors to be Uniform and White," *IEEE Transactions on Acoustics, Speech, and Signal Processing*, vol. ASSP-25, No. 5, pp. 442-448, Oct. 1977.

Wismar et al., "A 0.2 V, 7.5 µW, 20 kHz ΣΔ modulator with 69 dB SNR in 90 nm CMOS," *European Solid-State Circuits Conference*, pp. 206-209, Sep. 2007.

Yang et al, "A 100mW 10MHz-BW CT ΔΣ Modulator with 87dB DR and 91dBc IMD", *IEEE International Solid-State Circuits Conference*, pp. 498-499, Feb. 2008.

\* cited by examiner

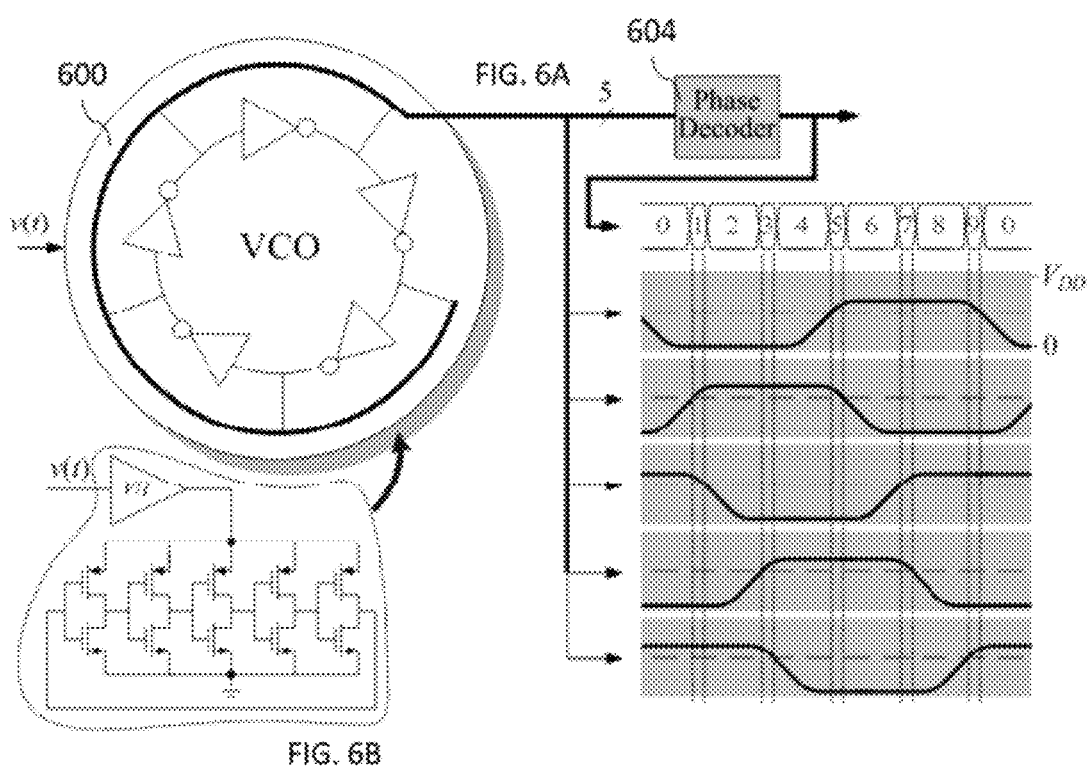

RING OSCILLATOR DELTA SIGMA ADC MODULATOR WITH REPLICA PATH NONLINEARITY CALIBRATION

PRIORITY CLAIM AND REFERENCE TO RELATED APPLICATION

The application claims priority under 35 U.S.C. §119 from prior provisional application Ser. No. 61/437,297, which was filed Jan. 28, 2011 and entitled Mostly-Digital Oversampling ADC with Background Nonlinearity Calibration and Self-Cancelling Dither.

FIELD

A field of the invention is very high speed analog to digital converters (ADCs), and particularly, continuous-time delta-sigma modulator ADCs with clock rates several hundred MHz. ADCs and analog to digital conversion methods of the invention are widely applicable. Particular example applications include implementation in digital radio receivers such as used in cellular handsets and devices, TV tuners, and wireless LAN receivers.

BACKGROUND

In many analog-to-digital converter (ADC) applications such as wireless receiver handsets, the bandwidth of the analog signal of interest is narrow relative to practical ADC sample-rates. Delta-sigma ($\Delta\Sigma$) modulator ADCs are used almost exclusively in such applications because they offer exceptional efficiency and relax the analog filtering required prior to digitization. Continuous-time $\Delta\Sigma$ modulator ADCs with clock rates above several hundred MHz have been shown to be particularly good in these respects. See, e.g., W. Yang et al, "A 100 mW 10 MHz-BW CT $\Delta\Sigma$ Modulator with 87 dB DR and 91 dBc IMD", *IEEE International Solid-State Circuits Conference*, pp. 498-499, February 2008; G. Mittergger et al., "A 20-mW 640-MHz CMOS Continuous-Time $\Delta\Sigma$ ADC With 20-MHz Signal Bandwidth, 80-dB Dynamic Range and 12-bit ENOB," *IEEE Journal of Solid-State Circuits*, vol. 41, no. 12, pp. 2641-2649, December 2006; Park et al, "A 0.13 µm CMOS 78 dB SNDR 87 mW 20 MHz BW CT $\Delta\Sigma$ ADC with VCO-Based Integrator and Quantizer," *IEEE International Solid-State Circuits Conference*, pp. 170-171, February 2009; V. Dhanasekaran et al., "A 20 mHz BW 68 dB DR CT $\Delta\Sigma$ ADC Based on a Multi-Bit Time-Domain Quantizer and Feedback Element," *IEEE International Solid-State Circuits Conference*, pp. 174-175, February 2009.

Typical conventional analog $\Delta\Sigma$ modulators present significant design challenges when implemented in highly-scaled CMOS IC technology optimized for digital circuitry. Such conventional $\Delta\Sigma$ modulators require analog comparators, high-accuracy analog integrators, high-linearity feedback digital to analog converters (DACs), and low-noise, low-impedance reference voltage sources. Continuous-time $\Delta\Sigma$ modulators with continuous-time feedback DACs additionally require low-jitter clock sources. These circuit blocks are increasingly difficult to design as CMOS technology is scaled below the 90 nm node because the scaling tends to worsen supply voltage limitations, device leakage, device nonlinearity, signal isolation, and 1/f noise.

An alternate type of $\Delta\Sigma$ modulator avoids the analog blocks and consists of a voltage-controlled ring oscillator (ring VCO) with its inverters sampled at the desired output sample-rate followed by digital circuitry. See, e.g., Hovin et al., "Delta-Sigma Modulators Using Frequency-Modulated Intermediate Values," *IEEE Journal of Solid-State Circuits*, vol. 32, no. 1, pp. 13-22, January 1997; Kim et al, "A Time-Based Analog-to-Digital Converter Using a Multi-Phase Voltage-Controlled Oscillator," *IEEE International Symposium on Circuits and Systems*, pp. 3934-3937, May 2006; Naiknaware et al, "Time-Referenced Single-Path Multi-Bit $\Delta\Sigma$ ADC using a VCO-Based Quantizer," *IEEE Transactions on Circuits and Systems—II: Analog and Digital Signal Processing*, vol. 47, no. 7, pp. 596-602, July 2000; Iwata et al., "The Architecture of Delta Sigma Analog-to-Digital Converters Using a Voltage-Controlled Oscillator as a Multibit Quantizer," *IEEE Transactions on Circuits and Systems—II: Analog and Digital Signal Processing*, vol. 46, no. 7, pp. 941-945, July 1999; Wismar et al., "A 0.2 V, 7.5 µW, 20 kHz $\Sigma\Delta$ modulator with 69 dB SNR in 90 nm CMOS," *European Solid-State Circuits Conference*, pp. 206-209, September 2007; Opteynde, "A Maximally-Digital Radio Receiver Front-End," *IEEE International Solid-State Circuits Conference*, pp. 450-451, February 2010.

Although the ring VCO inevitably introduces severe nonlinearity, the structure otherwise has the same functionality as a first-order continuous-time $\Delta\Sigma$ modulator. Unfortunately, the nonlinearity problem and the high spurious tone content of first-order $\Delta\Sigma$ modulator quantization noise has limited the deployment of such VCO-based $\Delta\Sigma$ modulators to date. To the knowledge of the present inventors, the only previously published method of circumventing these problems is to use the VCO-based $\Delta\Sigma$ modulator as the last stage of an otherwise conventional analog $\Delta\Sigma$ modulator, but this solution still requires all the high-performance analog blocks of a conventional analog $\Delta\Sigma$ modulator except comparators. See, Straayer et al, "A 12-Bit, 10-MHz Bandwidth, Continuous-Time $\Sigma\Delta$ ADC With a 5-Bit, 950-MS/s VCO-Based Quantizer," *IEEE Journal of Solid-State Circuits*, vol. 43, no. 4, April 2008.

SUMMARY OF THE INVENTION

An embodiment provides a continuous-time delta-sigma modulator for analog-to-digital conversion. The modulator includes a signal path generating including a ring voltage controlled oscillator driven by an analog input signal. The signal path produces digital values by sampling the ring voltage controlled oscillator. A calibration circuit measures nonlinear distortion coefficients in a replica of the signal path. A nonlinearity corrector corrects the digital values based upon determined nonlinear distortion coefficients.

BRIEF DESCRIPTION OF THE DRAWINGS

FIG. 1A shows a generic VCO-based $\Delta\Sigma$ modulator, FIG. 1B shows the cascade of a continuous-time lowpass filter, sampler, quantizer, and digital differentiator, and FIG. 1C the cascade of a continuous-time lowpass filter, sampler and first-order $\Delta\Sigma$ modulator;

FIG. 6 illustrates an example signal-dependent non-uniform quantization problem;

DETAILED DESCRIPTION OF THE PREFERRED EMBODIMENTS

Figure 1A:
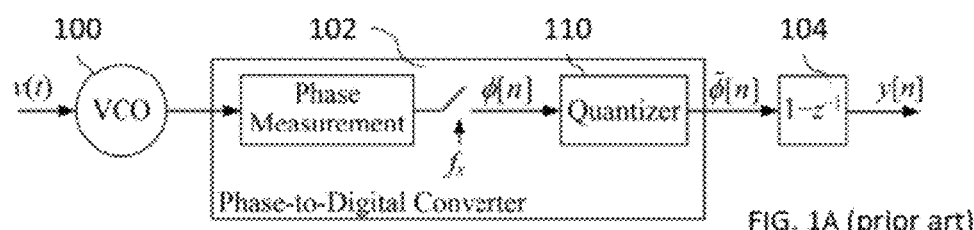
FIGS. 1A-1C (prior art) show functional block diagrams of equivalent systems, specifically

Embodiments of the invention provide a continuous-time delta-sigma modulator for analog-to-digital conversion that consists mostly of digital circuitry. Preferred embodiment ΔΣ modulators of the invention can be realized with and preferably consist essentially of a signal converter and a calibration unit. The signal converter includes voltage controlled ring oscillator paths and digital processing blocks. Each voltage controlled ring oscillator path includes a differential voltage-to-current circuit, a pair of current-controlled ring oscillators, and digital processing blocks. Inverters in each oscillator are sampled at an output sample rate and a resulting bit sequence is converted to a phase sequence, digitally differentiated and applied to a nonlinearity correction block. In preferred embodiments, the nonlinearity correction block is look-up-table based. Outputs of nonlinearity correction blocks are differenced and the result added to the other of the signal paths to form the ΔΣ modulator output.

Preferred embodiment ΔΣ modulators of the invention can be realized with and preferably consist essentially of a signal converter and a calibration unit. The signal converter includes voltage controlled ring oscillator (VCRO) paths and digital processing blocks. Each VCRO path includes a differential voltage-to-current (V/I) circuit, a pair of current-controlled ring oscillators (ICROs), and digital processing blocks. Inverters in each ICRO are sampled at an output sample rate and a resulting bit sequence is converted to a phase sequence, digitally differentiated and applied to a nonlinearity correction block. In preferred embodiments, the nonlinearity correction block is look-up-table based. Outputs of nonlinearity correction blocks are differenced and the result added to the other of the signal paths to form the ΔΣ modulator output. Embodiments of the invention provide a continuous-time delta-sigma modulator for analog-to-digital conversion that consists essentially of digital circuitry.

A dither sequence is preferably added to each of the ICRO signal paths. The architecture of preferred embodiments facilitates dither cancellation and even-order distortion suppression. The dither is added positively in one of the VCRO paths and negatively in the other path, so it is largely cancelled when the two VCRO path outputs are summed. The two ICROs in each VCRO path are driven differentially to partially suppress $2^{nd}$-order distortion, which simplifies the nonlinearity correction blocks by reducing the accuracy with which $2^{nd}$-order distortion must be suppressed.

Preferred embodiment ADC ΔΣ modulators do not require any analog integrators, feedback DACs, comparators, or reference voltages, and do not require a low jitter clock. Unlike conventional ΔΣ modulators, performance depends mainly on the speed of its digital circuitry, so modulators of the invention are preferably implemented in IC processes optimized for fast digital circuitry.

Preferred modulators of the invention provide a voltage-controlled ring oscillator based design with digital background calibration and self cancelling dither techniques that enhance performance compared to conventional devices. Unlike conventional delta-sigma modulators, embodiments of the invention do not contain analog integrators, feedback DACs, comparators, or reference voltages, and do not require a low jitter clock. Advantageously, a delta-sigma modulator of the invention can uses less area than comparable conventional delta-sigma modulators, and the architecture is well-suited to IC processes optimized for fast digital circuitry.

Embodiments of the invention provide a reconfigurable continuous-time delta-sigma modulator for analog-to-digital conversion that consists mostly of digital circuitry. Its voltage-controlled ring oscillator based design includes digital background calibration and self-cancelling dither techniques applied to enhance performance. The architecture is well-suited to IC processes optimized for fast digital circuitry. A prototype IC has been implemented in 65 nm LP CMOS technology with power dissipation, output sample-rate, bandwidth, and peak SNDR ranges of 8-17 mW, 0.5-1.15 GHz, 3.9-18 MHz, and 67-78 dB, respectively, and an active area of 0.07 mm².

A VCO-based ΔΣ modulator of the invention incorporates digital background correction of VCO nonlinearity and self-cancelling dither. Self-cancelling dither is disclosed in Galton & Taylor, "A Mostly Digital Variable-Rate Continuous-Time ADC ΔΣ Modulator," *IEEE International Solid-State Circuits Conference*, pp. 298-299, February, 2010. The digital background calibration technique is a modification of a technique that has been used to correct nonlinear distortion in pipelined ADCs, see, Galton & Panigada, "Digital Background Correction of Harmonic Distortion in Pipelined ADCs," *Circuits and Systems—I: Regular Papers, IEEE Transactions on*, vol. 53, no. 9, pp. 1885-1895, September 2006; Galton & Panigada, "A 130 mW 100 MS/s Pipelined ADC with 69 dB SNDR Enabled by Digital Harmonic Distortion Correction," *IEEE Journal of Solid-State Circuits*, vol. 44, no. 12, pp. 3314-3328, December 2009; but has not been considered by artisans or found application for delta sigma modulator based ADCs. The self-cancelling dither technique eliminates the spurious tone problem by adding dither sequences prior to quantization and then cancelling them in the digital domain. Additionally, the ΔΣ modulator uses a digital calibration technique that enables reconfigurability by automatically retuning the VCO's center frequency whenever the ΔΣ modulator's sample-rate is changed.

The digital background calibration and self-cancelling dither techniques of the invention enable preferred embodiment ΔΣ modulators to achieve high-performance data conversion without analog integrators, feedback DACs, comparators, reference voltages, or a low-jitter clock. Modulators of the invention use less area than comparable conventional analog ΔΣ modulators, and the architecture is well-suited to highly-scaled CMOS technology optimized for fast digital circuitry.

Preferred embodiments of the invention will be discussed with respect to the drawings. The drawings may include schematic representations, which will be understood by artisans in view of the general knowledge in the art and the description that follows. Prior to discussing preferred embodiments, background principles of ring based ΔΣ modulators will be discussed.

VCO-Based ΔΣ Modulator Overview

An idealized VCO-based ΔΣ modulator with a continuous-time input voltage, v(t), and a digital output signal, y[n], is shown in FIG. 1A. It consists of a VCO 100, a phase-to-digital converter 102, and a digital differentiator block 104 with a transfer function of $1-z^{-1}$. Ideally, the instantaneous frequency of the VCO is $$f_{VCO}(t) = f_s + \frac{K_{VCO}}{2\pi}v(t) \quad (1)$$

where $f_s$ is the center frequency of the VCO in Hz, and $K_{VCO}$ is the VCO gain in radians per second per volt. The phase-to-digital converter quantizes the VCO phase, i.e., the time integral of the instantaneous frequency, and generates output samples of the result at times $nT_s$, n=0, 1, 2, . . . , where $T_s=1/f_s$.

In a practical implementation, the phase-to-digital converter would typically generate its output samples modulo one-cycle. It can be verified that provided $$0.5f_s < f_{VCO}(t) < 1.5f_s \quad (2)$$

for all t and another modulo one-cycle operation is performed after the digital differentiator, then the digital output signal is not affected by the modulo operations. Therefore, the modulo operations are not considered in the following to simplify the explanation.

Aside from an integer multiple of a cycle (which ultimately has no effect on y[n] because of the modulo operations), the nth output sample of the phase to digital converter in radians is a quantized version of $$\phi[n] = \int_0^{nT_s} K_{VCO}v(\tau)d\tau. \quad (3)$$

Equivalently, (3) can be written as $$\phi[n] = \sum_{k=1}^{n} \omega[k], \quad (4)$$

where $$\omega[n] = \int_{(n-1)T_s}^{nT_s} K_{VCO}v(\tau)d\tau. \quad (5)$$

It follows that ω[n] could have been obtained by passing v(t) through a lowpass continuous-time filter with transfer function $$H_c(f) = K_{VCO}e^{-j\pi T_s f}\frac{\sin(\pi T_s f)}{\pi f} \quad (6)$$

and sampling the output of the filter at a rate of $f_s$.

Figure 1B:
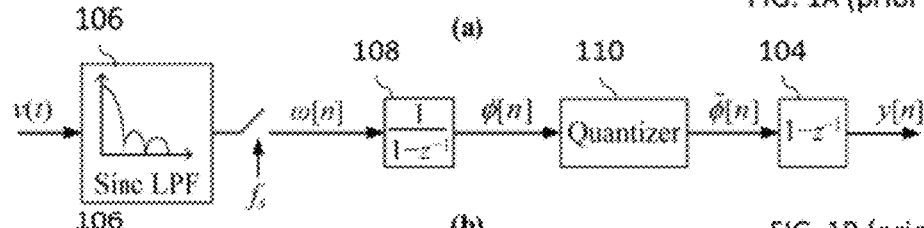

The system of FIG. 1B is, therefore, equivalent to that of FIG. 1A. A filter 106, integrator 108 and quantizer 110 are used in FIG. 1B. FIG. 1B obtains ω[n] by sampling a filtered version of the input signal as described above and implements equation (4) as the discrete-time integrator 108. The discrete-time integrator 108 is followed by the same quantizer and digital differentiator as in FIG. 1A to obtain y[n].

Figure 1C:
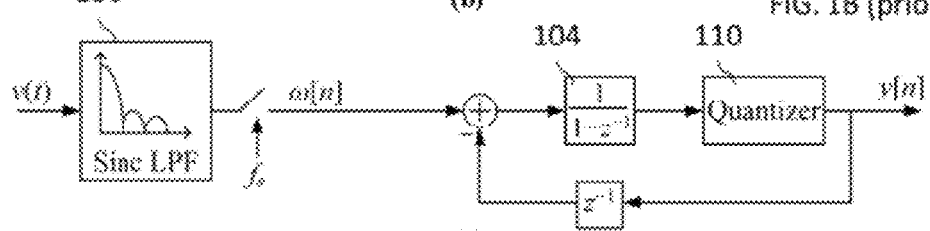

Given that the discrete-time integrator and differentiator both have integer-valued impulse responses, it can be verified that the system of FIG. 1B, and, hence, the system of FIG. 1A is equivalent to the system of FIG. 1C. Thus, the VCO-based ΔΣ modulator is equivalent to a conventional first-order continuous-time ΔΣ modulator, so it can be analyzed by applying well-known properties of the first-order ΔΣ modulator to the system of FIG. 1C. In particular $$y[n] = \omega[n] + e_{\Delta\Sigma}[n], \quad (7)$$

where $e_{\Delta\Sigma}[n]$ is first-order highpass shaped quantization noise.

Ring VCO Implementation

Figures 2A, 2B:
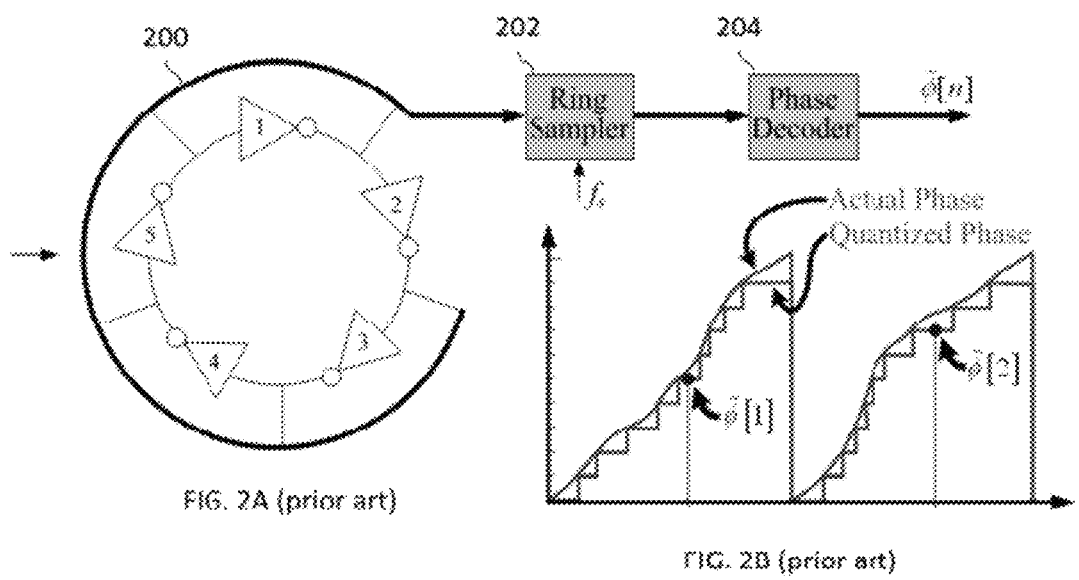
FIGS. 2A and 2B (prior art) show an example ring VCO and phase-to-digital converter.

A practical topology with which to implement the VCO and phase-to-digital converter is shown in FIGS. 2A and 2B. In this example, the VCO is a ring oscillator 200 that consists of five inverters, each with a transition delay that depends on the VCO input voltage, v(t). A ring sampler 202 includes a corresponding number of five flip-flops clocked at a rate of $f_s$, where the D input of each flip-flop is driven by the output of one of the VCO's inverters. At each rising edge of the clock signal, i.e., at times $nT_s$, the output of each flip-flop is set high if the corresponding VCO inverter output signal at that time is above the flip-flop's digital logic threshold of approximately half the supply voltage, and is set low otherwise.

A well known property of ring oscillators is that at any given time during oscillation, exactly one of the VCO's inverters is in a state of either positive transition or negative transition, i.e., a state in which the inverter's input and output are both below or both above the digital logic thresholds of the flip-flops to which they are connected, respectively. For example, suppose Inverter 1 in FIG. 2 enters positive transition at time $t_0$. The inverter remains in positive transition until a time $t_1$ at which its output rises above the digital logic threshold of the flip-flop to which it is connected. At this same instant, Inverter 2 enters negative transition. This process continues in a clockwise direction around the VCO such that Inverter (1+(i mod 5)) is in positive transition from time $t_i$ to time $t_{i+1}$ if i is even, and is in negative transition from time $t_i$ to time $t_{i+1}$ if i is odd for i=0, 1, 2, . . . , where $t_{i-1} > t_i$.

Therefore, each inverter goes once into positive transition and once into negative transition during each VCO period, and there are only 10 possible 5-bit values that the ring sampler can generate regardless of when it is sampled. A phase decoder 204 maps each of the 10 values into a phase number, $\tilde{\phi}[n]$, in the range {0, 1, 2, . . . , 9} (the corresponding phase in radians is given by $2\pi\tilde{\phi}[n]/10$). Since each phase number corresponds to one of the inverters being in a state of transition and there are 10 such states per VCO period, $\tilde{\phi}[n]$ represents the phase of the VCO modulo one-cycle quantized to the nearest 10th of a cycle as depicted in FIG. 2B.

Ideally, the VCO inverters are such that the ith transition delay is given by $$t_{i+1} - t_i = \frac{1}{10}[T_s - K_d \bar{v}(t_i, t_{i+1})]. \tag{8}$$

where $$\bar{v}(t_i, t_{i+1}) = \frac{1}{t_{i+1} - t_i} \int_{t_i}^{t_{i+1}} v(t) dt \tag{9}$$

is the average value of v(t) over the time interval from $t_i$ to $t_{i+1}$. This time interval represents a 10th of the corresponding VCO cycle as described above, so (8) implies that the VCO's average frequency during this time interval, i.e., $$\frac{1}{t_{i+1} - t_i} \int_{t_i}^{t_{i+1}} f_{VCO}(t) dt \tag{10}$$

where $f_{VCO}(t)$ is the VCO's instantaneous frequency at time t, can be written as $$\frac{1}{10(t_{i+1} - t_i)}. \tag{11}$$

Substituting (8) into (11) and expanding the result as a power series yields $$\frac{1}{t_{i+1} - t_i} \int_{t_i}^{t_{i+1}} f_{VCO}(t) dt = \frac{1}{T_s} \sum_{n=0}^{\infty} \left(\frac{K_d}{T_s} \bar{v}(t_i, t_{i+1})\right)^n. \tag{12}$$

Provided that v(t) does not change significantly between $t_i$ and $t_{i+1}$, it follows that the VCO can be modeled as having an instantaneous frequency given by $$f_{VCO}(t) = f_s + \frac{K_{VCO}}{2\pi} v(t) + \frac{1}{T_s} \sum_{n=2}^{\infty} \left(\frac{T_s K_{VCO}}{2\pi} v(t)\right)^n \tag{13}$$

where $K_{VCO} \equiv 2\pi K_d / T_s^2$.

The Nonlinearity Problem

A comparison of the instantaneous frequency of the ring VCO given by (13) to the ideal instantaneous frequency given by (1) indicates that the ring VCO introduces nonlinear distortion. Applying the above analysis provides the conclusion that the distortion causes the input to the first-order ΔΣ modulator in the equivalent system of FIG. 1C to be $$\omega[n] + \int_{(n-1)T_s}^{nT_s} \left[\frac{2\pi}{T_s} \sum_{i=2}^{\infty} \left(\frac{T_s K_{VCO}}{2\pi} v(\tau)\right)^i\right] d\tau \tag{14}$$

instead of just ω[n]. It follows from (5) and (7) that provided v(t) does not change significantly over each sample interval, the output of the ΔΣ modulator is $$y[n] = \omega[n] + e_{\Delta\Sigma}[n] + \sum_{i=2}^{\infty} \alpha_i (\omega[n])^i, \tag{15}$$

where $$\alpha_i \cong \left(\frac{1}{2\pi}\right)^{i-1}, \tag{16}$$

for i=2, 3, . . . , are nonlinear distortion coefficients.

The nonlinearity is not the result of non-ideal circuit behavior. It is a systematic nonlinearity that occurs even with ideal circuit behavior. The problem is that the VCO's period changes linearly with v(t), but to eliminate the nonlinear terms in (14) it would be necessary for the VCO's frequency to change linearity with v(t). It is the reciprocal relationship between VCO's period and frequency that give rise to the nonlinear terms in (14). Of course, in practice the relationship between the inverter delays and the input voltage is not perfectly linear as assumed by (8). While this introduces additional significant nonlinearity it tends to be less severe than the reciprocal nonlinearity described above.

Transistor-level simulations of the VCO-based ΔΣ modulator described above with the 15-element VCO designed for the IC prototype presented in this description support these findings and demonstrate the severity of the problem. For instance, the output of the simulated ΔΣ modulator with $f_s$=1.152 GHz and a full-scale 250 KHz sinusoidal input signal has second, third, and fourth harmonics at −26 dBc, −47 dBc, and −64 dBc, respectively.

However, when the simulated output sequence is corrected in the digital domain to cancel just the second-, third-, and fourth-order distortion terms using methods of the invention, the largest harmonic in the corrected sequence is less than −90 dBc. It can be verified that the method used to cancel the $\alpha_3$ term in (15) introduces a fifth-order term that happens to largely cancel the $\alpha_5$ term in (15) as a side-effect. This analysis indicates that for the target specifications of an IC prototype presented in the following description of preferred embodiments it is only necessary to cancel the second-, third-, and fourth-order distortion terms to achieve excellent performance.

Preferred Embodiment Modulators

Two types of digital background calibration are implemented in each ΔΣ modulator that is discussed below: 1) digital background cancellation of VCO-induced second-order and third-order distortion, and 2) digital background tuning of the VCO's center frequency to the ΔΣ modulator's sample rate, $f_s$. The former in combination with a pseudo-differential architecture addresses the nonlinearity problem described above. The latter centers the input range of the ΔΣ modulator about the midscale input voltage. This maximizes the dynamic range, and enables reconfigurability by automatically retuning the VCO's center frequency whenever $f_s$ is changed.

Figure 3:
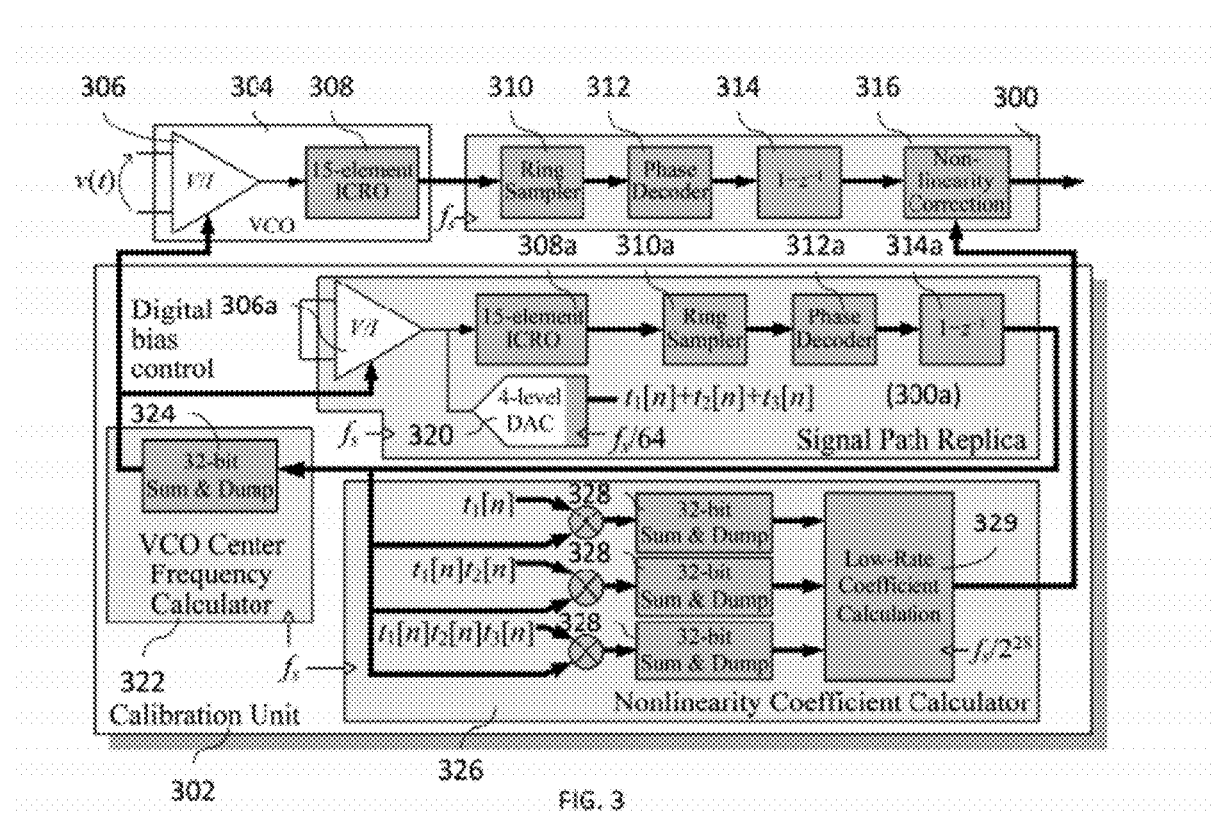
FIG. 3 is a block diagram of a preferred embodiment oversampling ADC illustrated with a single VCO-based $\Delta\Sigma$ modulator signal path for simplicity.

FIG. 3 shows a preferred embodiment VCO-based ΔΣ modulator signal path 300 and an on-chip calibration unit 302 shared by all the signal paths in both ΔΣ modulators. The signal path is similar to the VCO-based ΔΣ modulator described above in FIGS. 1 and 2, except that a VCO 304 is implemented as a voltage-to-current (V/I) converter 306 followed by a 15-element current-controlled ring oscillator (ICRO) 308, and it contains a nonlinearity correction block that cancels the distortion terms in equation (15). The signal processing unit 300 includes a ring sampler 310 that has a corresponding number of flip flops to the ICRO 308 and the flip flops are clocked at a rate of $f_s$, where the D input of each flip-flop is driven by the output of one of the VCO's inverters. The phase decoder 312 maps a corresponding number of values into a phase number and is differentiated by a digital differentiator block 314 with a transfer function of $1-z^{-1}$. Correction 316 is introduced based upon the calibration unit 302.

The calibration unit 302 measures the VCO center frequency and nonlinear distortion of a signal path replica 300a, and generates digital data used by the nonlinearity correction 316 and the converter 306 in the actual signal path 300 to properly tune the VCO's center frequency and cancel nonlinear distortion. The replica path 300a is labeled with reference numerals used in the signal path 300 plus the additional moniker "a". The calibration unit 302 operates continuously in background, and periodically updates its output data with new measurement results.

The calibration unit's signal path replica 300a is identical to the actual signal path including the VCO 304 and the signal processing unit 300 except that it does not have a nonlinearity correction block, its differential input voltage is zero (i.e., it has a constant, midscale input signal), and a four-level current steering $f_s/64$-rate DAC 320 adds a calibration sequence to the input of its ICRO 308a. The calibration sequence is $t_1[n]+t_2[n]+t_3[n]$ where the $t_i[n]$ sequences are 2-level, independent, zero-mean, pseudo-random sequences. Lowering the calibration DAC 320 clock rate increases the calibration period but reduces the overall error introduced by the DAC transitions. In the example here, the rate of $f_s/64$-rate was selected because 64 was the smallest modulo-2 divisor that provided adequate calibration DAC performance in the calibration unit 302.

VCO Center Frequency Calibration

A VCO center frequency calculator block 322 adds each successive set of $2^{28}$ output samples from the signal path replica and scales the result by a constant, K, to create an $f_s/228$-rate digital sequence given by $$\Delta I[m] = K \sum_{i=0}^{P-1} r[mP+i] \tag{17}$$

where $P=2^{28}$, and $r[n]$ is the output of the signal path replica. The eight most significant bits (MSBs) of this sequence are determined by the sum & dump 324 and are used to adjust the output current of the V/I converter 306a in the signal path replica. This forms a negative feedback loop with a bandwidth that depends on K. The feedback drives the VCO's output frequency to the point at which $r[n]$ has zero mean. The frequency to which the VCO converges is $f_s$, because the VCO's input voltage is zero and the calibration sequence has a mean of zero. The V/I converter 306 in the actual signal path is also adjusted by the $\Delta I[m]$ sequence. To the extent that the signal path and signal path replica match, this causes the signal path's VCO 304 to have a frequency very close to $f_s$ when $v(t)=0$.

The choice of the constant K in equation 17 is not critical because settling error in the loop introduces only as a small common-mode error in the $\Delta\Sigma$ modulator. In the prototype IC discussed below, K was chosen to achieve one-step settling.

Nonlinearity Correction

The nonlinearity correction block 316 in the signal path is a high-speed look-up table with mapping data updated periodically by a nonlinearity coefficient calculator block 326 of the calibration unit. The look-up table maps each 5-bit input sample, $y[n]$, into an output sample, $y[n]|_{corrected}$, such that $$y[n]|_{corrected} = y[n] - \tilde{\alpha}_2(y[n])^2 - (\tilde{\alpha}_3 - 2\tilde{\alpha}_2^2)(y[n]) - \tilde{\alpha}_2(y[n])^2)^3 \tag{18}$$

where $\tilde{\alpha}_2$, and $\alpha\tilde{\alpha}_3$ are measurements of the $\alpha_2$ and $\alpha_3$ coefficients in equation (15), respectively. It can be verified that if $\tilde{\alpha}_i = \alpha_i$, for $i=2$ and 3, then $y[n]|_{corrected}$ does not contain any VCO-induced second-order or third-order distortion terms.

Applying equation (18) to obtain $y[n]|_{corrected}$ also has some side effects. A positive side effect is that it adds a fifth-order term that happens to nearly cancel the portion of the fifth-order distortion corresponding to $\alpha_5$ given by equation (16). Negative side effects are that it adds higher-order distortion terms and cross terms that include $(e_{\Delta\Sigma}[n])^i$ for $i=2$, 3, 4, 5, and 6. Fortunately, these terms are sufficiently small that they do not significantly degrade the simulated or measured performance of the $\Delta\Sigma$ modulator. The cross terms containing $(e_{\Delta\Sigma}[n])^i$ fold some of the $\Delta\Sigma$ quantization noise into the signal band but the folded noise is well below the overall signal band noise floor of the $\Delta\Sigma$ modulator. This is because the 15-element ring oscillator quantizes each phase estimate to within 1/30 of a VCO period so $e_{\Delta\Sigma}[n]$ is small relative to $\omega[n]$. Had a VCO with fewer ring elements been used, the folding of $\Delta\Sigma$ quantization noise into the signal band would not necessarily have been negligible. Thus, the number of elements in the ICRO 308 of the VCO 304 is preferably chosen to make quantization noise negligible.

Nonlinearity Coefficient Measurement

The purpose of the nonlinearity coefficient calculator block 326 is to generate the 30 values of equation (18) that correspond to the 30 possible values of $y[n]$. While using the values of $\alpha_2$ and $\alpha_3$ given by equation (16) for $\tilde{\alpha}_2$ and $\tilde{\alpha}_3$, respectively, in equation (18) would result in cancellation of much of the nonlinear distortion, it would not address nonlinear distortion arising from non-ideal circuit behavior, and simulations suggest that this would limit the ADC's signal-to-noise-and-distortion-ratio (SNDR) to between 60 dB and 65 dB.

Therefore, the calibration unit 302 continuously measures $\alpha_2$ and $\alpha_3$ by correlating the output of the signal path replica against the three 2-level sequences: $t_1[n]$, $t_1[n] \times t_2[n]$, and $t_1[n] \times t_2[n] \times t_3[n]$, to obtain the three $f_s/2^{28}$-rate sequences given by $$\gamma_1[m] = \frac{1}{P} \sum_{i=0}^{P-1} r[mP+i] t_1[mP+i], \tag{19}$$

$$\gamma_2[m] = \frac{1}{P} \sum_{i=0}^{P-1} r[mP+i] t_1[mP+i] t_2[mP+i], \tag{20}$$

and $$\gamma_3[m] = \frac{1}{P} \sum_{i=0}^{P-1} r[mP+i] t_1[mP+i] t_2[mP+i] t_3[mP+i]. \tag{21}$$

where $P=2^{28}$. It can be verified that when the signal path replica's VCO frequency is $f_s$, $$\frac{\gamma_2}{2\gamma_1^2} \approx \alpha_2 \text{ and } \frac{\gamma_3}{6\gamma_1^3} \approx \alpha_3. \tag{22}$$

Therefore, the nonlinearity coefficient calculator block 329 calculates the 30 values of the look-up table of equation (18) with $$\tilde{\alpha}_2 \triangleq \frac{y_2}{2y_1^2} \text{ and } \tilde{\alpha}_3 \triangleq \frac{y_3}{6y_1^3} \tag{23}$$

It does this and loads the 30 values into the nonlinearity correction block's look-up table once every $2^{28}T_s$ seconds.

The nonlinearity calibration method is based on the same principle as that presented in Panigada & Galton, "A 130 mW 100 MS/s Pipelined ADC with 69 dB SNDR Enabled by Digital Harmonic Distortion Correction," *IEEE Journal of Solid-State Circuits*, vol. 44, no. 12, pp. 3314-3328, December 2009. However, the present calibration measures the nonlinear distortion coefficients of a signal path replica instead of the actual signal path. This eliminates what would have been unwanted terms corresponding to v(t) in the correlator output sequences, $\gamma_i[n]$. The variance of each such term is proportional to 1/P, so for large enough values of P the terms can be neglected. However, P would have had to be much larger than $2^{28}$ for the terms to be negligible, so the time required to measure the nonlinear distortion coefficients would have been much longer than the $2^{28}T_s$ seconds required by the system described above. For example, when $f_s$ is set to its maximum value of 1.152 GHz, the FIG. 3 embodiment with a replica path requires 233 ms to measure the nonlinear distortion coefficients, whereas several tens of seconds would have been required had a signal path replica not been used.

The peak amplitude of the calibration signal also affects the time required to measure the nonlinear distortion coefficients. Each time the amplitude is doubled, P can be divided by four without reducing the variances of the measured nonlinear coefficient values. Therefore, it is desirable to have as large of a calibration sequence as possible in the signal path replica that does not cause the path to overload.

B. Pseudo-Differential Topology

The accuracy with which the nonlinear distortion terms can be cancelled depends on how well the actual signal path matches the signal path replica and also on bandwidth limitations of the signal path itself. For example, transistor-level simulations of the system shown in FIG. 3 indicate that the nonlinearity correction block reduces the worst-case second-order distortion term from −28 dBc to −65 dBc.

Figure 4:
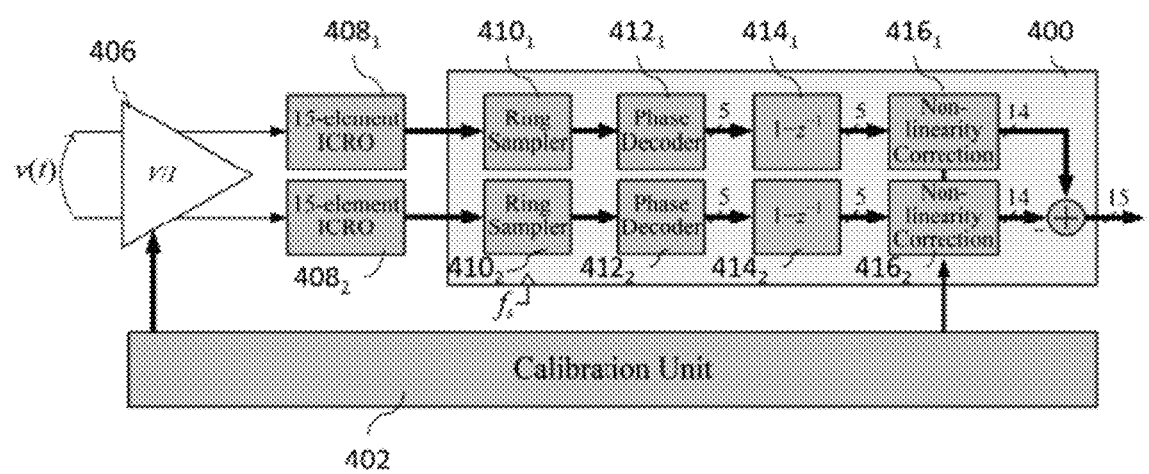
FIG. 4 is a block diagram of a preferred pseudo-differential mostly digital ADC of the invention illustrated with a dual VCO-based $\Delta\Sigma$ modulator signal path calibration unit and details of the calibration unit omitted.

A better result can be obtained by the FIG. 4. The FIG. 4 $\Delta\Sigma$ modulator combines two signal paths to form a single pseudo-differential signal path as shown in FIG. 4. The two signal paths differ from the signal path shown in FIG. 3 in that they share a single fully-differential V/I converter 406. Otherwise, the signal path blocks shown in FIG. 4 are the same as those shown in FIG. 3 and are labeled with similar reference numerals. Thus, considering the top path, there is the ICRO $408_1$, the ring sampler $410_1$, the phase decoder $412_1$, the differentiator $416_1$, and the non-linearity corrector $416_1$. The other half of the differential path includes the ICRO $408_2$, the ring sampler $410_2$, the phase decoder $412_2$, the differentiator $416_2$, and the non-linearity corrector $416_2$. FIG. 4 provides example output bit specifications. The output of the phase decoder $412_1$, is shown as a 5-bit output, which was selected since 5 is the minimum number of bits required to binary encode all 30 possible ring oscillator phase states generated by the 15-element ring oscillator. The output of the non-linearity corrector $416_2$ is similarly 14 bits as this was determined to be the minimum number of bits required to correct signal path non-linearity. The calibration unit 402 has the same general architecture as the calibration unit 302 in FIG. 3, except the replica signal path is not differential, i.e., it corresponds to a single half of the differential path signal path.

The outputs of the two signal paths at 416 are differenced to form the output of the pseudo-differential signal path. The differencing operation causes the residual even-order distortion components in the outputs of the two nonlinearity correction blocks to cancel up to the matching accuracy of the two signal paths.

Both differential and pseudo-differential architectures have been used previously in VCO-based $\Delta\Sigma$ modulators without the nonlinearity correction 416 of the invention as provided by the calibration unit 402. See, e.g., J. Kim, S. Cho, "A Time-Based Analog-to-Digital Converter Using a Multi-Phase Voltage-Controlled Oscillator," *IEEE International Symposium on Circuits and Systems*, pp. 3934-3937, May 2006; A. Iwata, N. Sakimura, M. Nagata, T. Morie, "The Architecture of Delta Sigma Analog-to-Digital Converters Using a Voltage-Controlled Oscillator as a Multibit Quantizer," *IEEE Transactions on Circuits and Systems—II: Analog and Digital Signal Processing*, vol. 46, no. 7, pp. 941-945, July 1999; U. Wismar, D. Wisland, P. Andreani, "A 0.2 V, 7.5 µW, 20 kHz $\Delta\Sigma$ modulator with 69 dB SNR in 90 nm CMOS," *European Solid-State Circuits Conference*, pp. 206-209, September 2007; F. Opteynde, "A Maximally-Digital Radio Receiver Front-End," *IEEE International Solid-State Circuits Conference*, pp. 450-451, February 2010.

Each approach offers the benefit of cancelling much of the even-order nonlinearity. Unfortunately, simulation and measurement results indicate that the expected matching accuracy of the two signal paths is not sufficient to cancel the worst-case second-order distortion term below about −65 dBc. Furthermore, while the pseudo-differential architecture is better for low voltage operation than the differential architecture, it has the disadvantage that the strong second-order distortion introduced by each ICRO introduces a large error component proportional to the product of the difference and sum of the two ICRO input currents. Therefore, in the absence of second-order nonlinearity correction prior to differencing the two signal paths, any common-mode error on the two ICRO input lines would be converted to a differential-mode error signal. These problems are addressed by having the nonlinearity correction blocks 416 in each signal path correct second-order distortion prior to the differencing operation.

The signal components in the output of the two signal paths have the same magnitudes and opposite signs, whereas the quantization noise and much of the circuit noise in the two outputs are uncorrelated. Therefore, the differencing operation increases the signal by 6 dB and increases the noise by approximately 3 dB, so the SNR of the pseudo-differential signal path is approximately 3 dB higher than that of each individual path.

C. Self-Cancelling Dither Method

The quantization noise from first-order $\Delta\Sigma$ modulators is notoriously poorly behaved, particularly for low-amplitude input signals. It often contains large spurious tones and can be strongly correlated to the input signal. In theory this problem can be solved by adding a dither sequence to the input of the $\Delta\Sigma$ modulator's quantizer. If the dither sequence is white and uniformly distributed over the quantization step size, it causes the quantizer to be well modeled as an additive source of white noise that is uncorrelated with the input signal. See, A. B. Sripad, D. L. Snyder, "A Necessary and Sufficient Condition for Quantization Errors to be Uniform and White," *IEEE Transactions on Acoustics, Speech, and Signal Processing*, vol. ASSP-25, no. 5, pp. 442-448, October 1977. The dither has the same variance and is subjected to the same noise transfer function as the quantization noise so it increases the noise floor of the $\Delta\Sigma$ modulator by no more than 3 dB.

A VCO-based ΔΣ modulator does not, however, provide a physical node at which to add such a dither sequence, because the integration and quantization are implemented simultaneously by the VCO. An option is to add the dither to the input of the ΔΣ modulator. This has the desired effect on the quantization noise, but severely degrades the signal-band SNR because the dither is not subjected to the ΔΣ modulator's highpass noise transfer function. While highpass shaping the dither prior to adding it to the input of the ΔΣ modulator would solve this problem, doing so tends to negate the positive effects of the dither on the quantization noise.

Figure 5A:
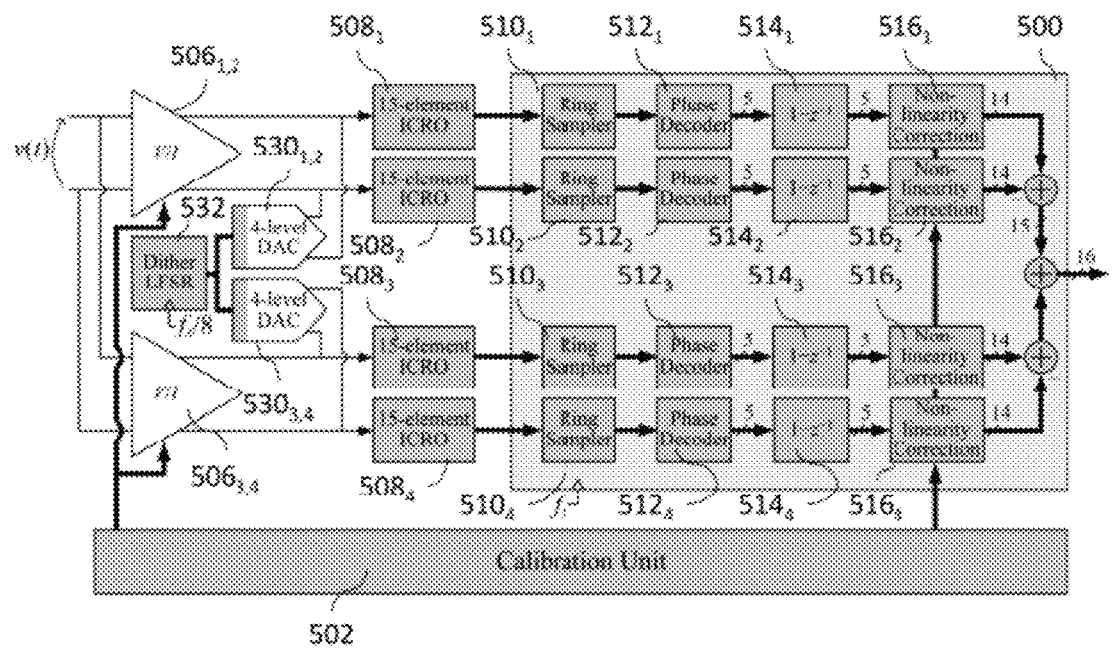
FIG. 5A is a high level block diagram of the signal converter for an experimentally implemented VCO-based ΔΣ modulator in accordance with a preferred embodiment.

Preferred embodiments of the invention use a self-cancelling dither method to circumvent these problems. This can be accomplished by constructing the ΔΣ modulator as the sum of two pseudo-differential signal paths each of the form shown in FIG. 4, but with a dither signal added to the input of one of the paths and subtracted from the input of the other path. This is shown in FIG. 5A, where similar reference numbers are used to indicate similar elements to FIGS. 3 and 4.

Figure 5B:
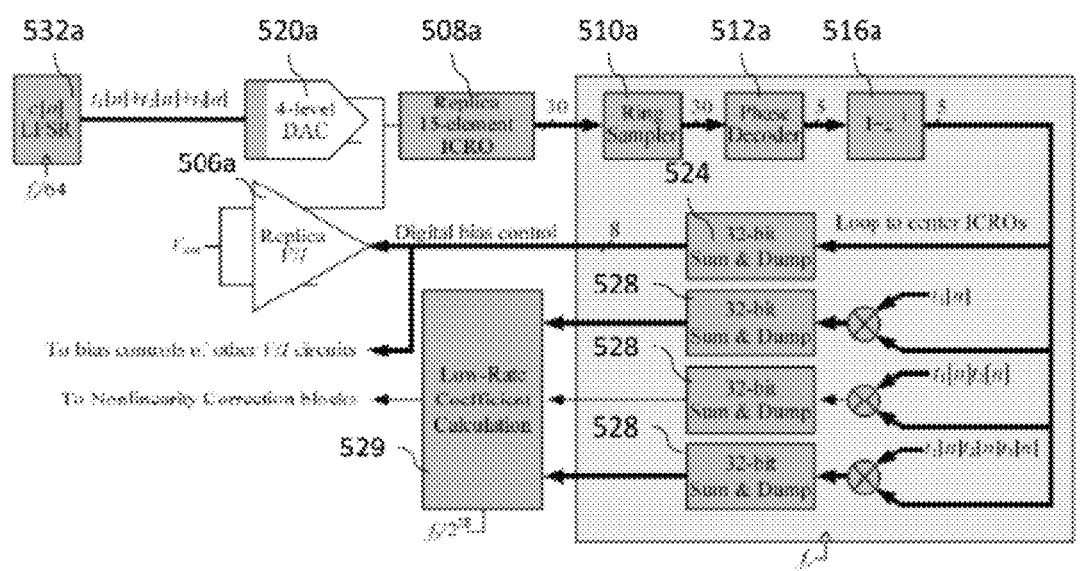
FIG. 5B is a block diagram of a preferred embodiment calibration unit for the FIG. 5A ΔΣ modulator.

The overall ΔΣ modulator output is the sum of the two pseudo-differential signal path outputs, with the first, differential path having the sub 1 and sub 2 reference numerals and the second differential path having the sub 3 and sub 4 reference numerals. Thus, each path includes the ICRO $508_n$, the ring sampler $410_n$, the phase decoder $412_n$, the differentiator $416_n$, and the non-linearity corrector $416_n$, wherein "n" is that path number. A pair of 4-level DACs $530_{1,2}$ and $530_{3,4}$ that add and subtract a pseudo-random dither sequence generated by a dither generator 532 to and from the top and bottom pseudo-differential signal paths, respectively, The outputs of the two pseudo-differential signal paths are added to form the ΔΣ modulator output sequence. The dither generator 532 provides each dither DAC 530 with a 4-level white pseudo-random sequence with a sample-rate of $f_s/8$. Each dither DAC $530_{1,2}$ and $530_{3,4}$ converts this sequence into a differential current signal with a peak-to-peak range approximately equal to the quantization step-size referred to the inputs of the ICROs $508_{1-4}$. Extensive system-level and circuit-level simulations and measurement results indicate that the dither whitens the noise injected by each ICRO's quantization process sufficiently to meet high level target specifications for the ΔΣ modulator, despite having only four levels and an update rate of only $f_s/8$. FIG. 5B shows the calibration unit, which is the same as that shown in FIG. 3, except that dither is also provided to the replica signal path, and is labeled with similar reference numerals.

The dither causes the quantization noise from each pseudo-differential signal path to be free of spurious tones and uncorrelated with the input signal and it also degrades the signal-band SNR of each pseudo-differential signal path. However, the dither components that cause the SNR degradation in the output sequences of the two pseudo-differential signal paths have equal magnitudes and opposite polarities, whereas the signal components in the two output sequences are identical, and the noise components in the two output sequences are uncorrelated. Therefore when the two output sequences are added, the unwanted dither components cancel, the signal components add in amplitude, and the noise components add in power. This results in an SNR that is 3 dB higher than would be achieved by a single pseudo-differential signal path in which the unwanted dither component were somehow subtracted directly. It does, however, double the circuit area and power dissipation, the implications of which are discussed below.

An advantage of the fine quantization performed by the 15-element ring oscillators is that low-amplitude dither sequences are effective. In this design, approximately 1 dB of dynamic range is used to accommodate the dither sequences.

An alternate approach to the self-cancelling dither method in FIG. 5A is to add a common-mode dither signal to a single pseudo-differential signal path, such as the path in FIG. 4. The dither would then be cancelled by the pseudo-differential signal path's final differencing operation. A disadvantage of this approach is that the second-order distortion correction performed by the nonlinearity correction blocks is not perfect, particularly at frequencies well above the signal band, so the residual second-order error would cause a small but potentially significant differential error term proportional to the product of the input and dither signals.

In FIG. 5A, each pseudo-differential signal path has an SNR that is 3 dB higher than that of its two non-differential signal paths, and adding the outputs of the two pseudo-differential signal paths results in a 3 dB improvement in SNR relative to that which could be achieved by a single pseudo-differential signal path. Therefore, compared to a single non-differential signal path, the four signal paths in the ΔΣ modulator consume four times the power and circuit area, but they also result in an SNR improvement of 6 dB. A commonly-used figure of merit for ΔΣ modulators is $$FOM = SNDR + 10\log_{10}\left(\frac{\text{signal bandwidth}}{\text{power dissipation}}\right) \quad (24)$$

with SNDR in dB. To the extent that the SNDR is noise-limited it follows that the use of multiple signal paths does not degrade the FOM.

Quantization Noise, No-Overload Range, and the Number of Ring Elements

As described above, well-known results for the first-order ΔΣ modulator can be applied to the VCO-based ΔΣ modulator. The theoretical maximum signal-to-quantization-noise-ratio, $SQNR_{max}$, is that of a conventional first-order ΔΣ modulator plus 6 dB to account for the four signal paths and minus 1 dB to account for the reduction in dynamic range required for dither. Hence, $$SQNR_{max} = 20\log_{10}(2M) + 30\log_{10}\left(\frac{f_s}{2B_s}\right) + 1.59, \quad (25)$$

where M is the number inverters in each ring oscillator (so the number of quantization steps is 2M), and $B_s$ is the signal bandwidth. The oversampling ratio is defined as $OSR=f_s/(2B_s)$. The no-overload range ΔΣ modulator is the range of input voltages for which (2) is satisfied, so it follows from (1) that the no-overload range is $$|v(t)| < \frac{\pi f_s}{K_{VCO}}. \quad (26)$$

Unlike a conventional ΔΣ modulator, $f_s$ and M in equation (25) cannot be chosen independently because $f_s=1/(M\tau_{inv})$ where $\tau_{inv}$ is the nominal delay of each VCO inverter when $v(t)=0$. For a given inverter topology, $\tau_{inv}$ is determined by the speed of the CMOS process. Therefore, to increase $f_s$ for a given design, it is necessary to reduce M proportionally. It follows from equation (25) that $SQNR_{max}$ increases by 3 dB each time $f_s$ is doubled for any given $\tau_{inv}$ and $B_s$. However, increasing $f_s$ has two negative side effects.

First, it increases the quantization noise folding because reducing M causes coarser quantization. Second, it increases the clock rate at which the digital circuitry following the ring oscillators must operate, which increases power consumption. The choice of 15-element ring oscillators for the example embodiments and a prototype IC that was fabricated in accordance with the architecture in FIGS. 5A and 5B was made on the basis of these considerations. The prototype IC will now be discussed.

Prototype Circuit Details
ICRO, Ring Sampler, and Phase Decoder

The prototype IC contains two identical ΔΣ modulators that each incorporate four of the basic VCO-based ΔΣ modulators described above as separate signal paths. It also includes additional components that implement the digital background calibration and self-cancelling dither methods in accordance with FIGS. 5A and 5B. The signal processing details of the ΔΣ modulator design and the reasons for using four such signal paths in a single ΔΣ modulator are discussed with respect to the prototype IC.

If the ring oscillator inverters have mismatched rise and fall times or signal-dependent amplitudes, the result is non-uniform quantization that can cause significant nonlinear distortion which is not corrected by the background calibration method. The problem is illustrated in FIG. 6 and FIG. 6B (which shows a MOSFET implementation) for the case of a 5-element ring oscillator implemented as a V/I converter that drives five current-starved inverters. The arrangement is like that shown in FIG. 2 and is labeled similarly, showing a ring converter 600 and phase decoder 604. The ring sampler is omitted to allow for a more simple explanation of the problem, however, the non-uniform quantization described also exists with a ring sampler in the signal path. The output waveform from each inverter is shown for the case of a constant VCO input voltage, i.e., a constant VCO frequency. The transition times and values that the phase decoder output would have if the ring sampler were bypassed are also shown. Each inverter waveform oscillates between a minimum voltage of zero and a maximum voltage that depends on the VCO input voltage. This causes the duration of each inverter's positive transition state to be much shorter than that of its negative transition state. The effect is evident in the non-uniform transition times of the phase decoder output. Since the amount of non-uniformity depends on the VCO's input signal, this phenomenon causes the ΔΣ modulator to introduce strong nonlinear distortion.

The implemented ΔΣ modulator avoids this problem with differential inverters 701 and a modified ring sampler and phase decoder. The solution is illustrated in FIG. 7, again for a 5-element ring oscillator 700 and a phase decoder 704. In this case, each inverter is defined to be in positive transition when its positive input voltage and positive output voltage are less than and greater than the digital logic threshold (e.g., half the supply voltage), respectively. Similarly, each inverter is defined to be in negative transition when its negative input voltage and negative output voltage are less than and greater than the digital logic threshold, respectively.

Figure 7:
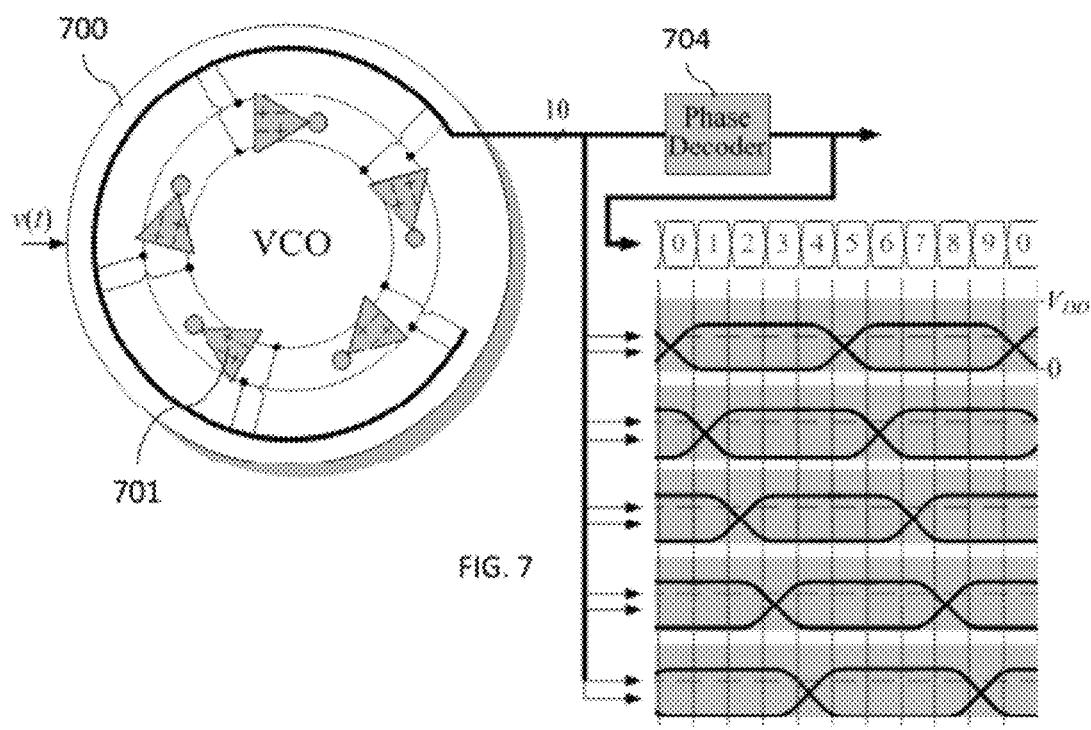
FIG. 7 illustrates a solution to the problem of FIG. 6.

Unlike the example shown in FIG. 6, the duration of each inverter's positive transition state in FIG. 7 is the same as that of its negative transition state because each of the times, $t_i$, occur only when a falling output from one of the inverters crosses the logic threshold. Therefore, the transition times of the phase decoder output are uniformly spaced for any given VCO frequency.

Figure 8:
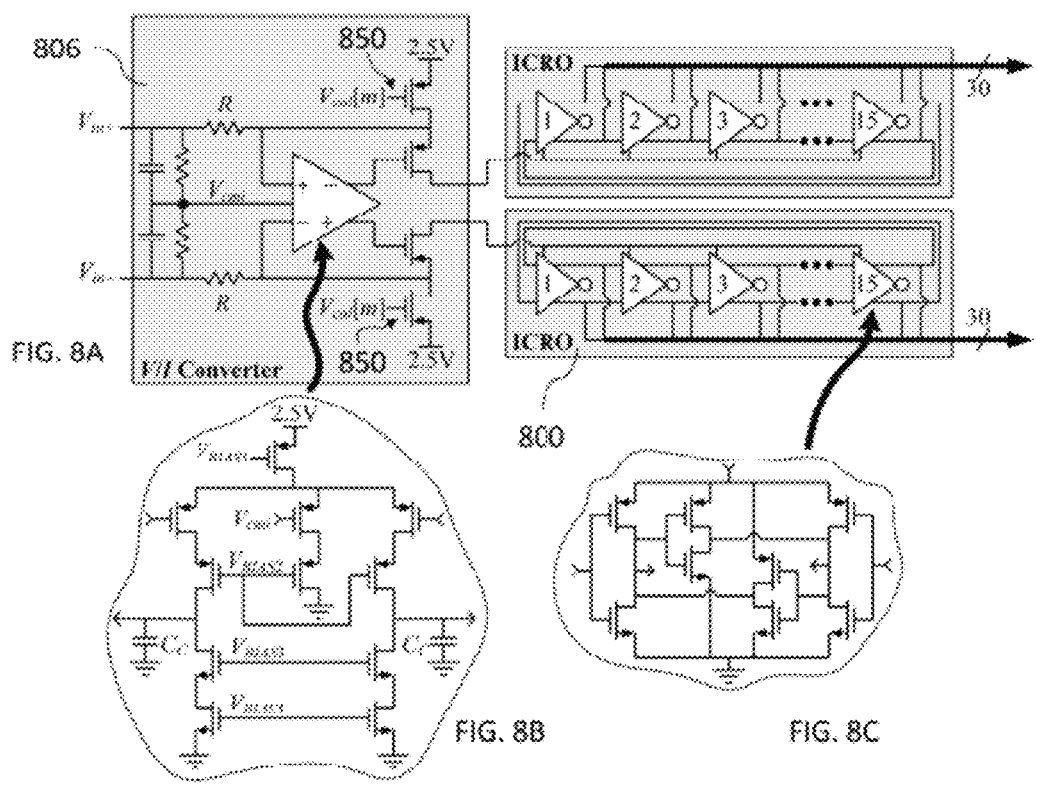
FIGS. 8A-8C illustrate example preferred circuit diagrams of the V/I converter and ICRO (current-controlled ring oscillator)

This idea can be applied to any ring oscillator with an odd number of elements. In particular, each ICRO 800 in the prototype IC is a ring of 15 current-starved pseudo-differential inverters as shown in FIGS. 8A-8C, with a differential V/I converter 806. The ring sampler latches the 30 inverter outputs on the rising edge of each $f_s$-rate clock, and the phase decoder calculates a corresponding instantaneous phase number by identifying which inverter was either in positive or negative transition at the last sample time as described with respect to FIG. 7.

V/I converter

The V/I converter 806 is also shown in more detail in FIG. 8A. The outputs are from a pair of pMOS cascode current sources 850 in which the gates of the cascode transistors are regulated by the outputs of a fully-differential op-amp, and current proportional to the differential input voltage is injected into the sources of the cascode transistors. To the extent that the op-amp input terminals present a differential virtual ground, the output current variation about the bias current into the top and bottom ICROs is $\frac{1}{2}(V_{in+}-V_{in-})/R$ and $\frac{1}{2}(V_{in+}-V_{in-})/R$, respectively.

The V/I converter 806 operates from a 2.5 V supply, so it consists of all thick-oxide transistors. The op-amp has a telescopic cascode structure with common-mode feedback achieved by sensing the common-mode input voltage. The simulated differential-mode open-loop gain and unity-gain bandwidth of the op-amp are 50 dB and 2.3 GHz, respectively, and the phase margin of the feedback loop is 55 degrees over worst-case process and temperature corners. Two-tone simulations across the 0 to $f_s/2$ frequency band with layout-extracted parasitics indicate that nonlinear distortion from the V/I converter is at least 20 dB less than that of the overall ΔΣ modulator regardless of input signal frequency.

The closed-loop bandwidth of the V/I converter 806 is approximately $g_m/C_C$, where $g_m$ is the transconductance of the op-amp's differential pair nMOS transistors and $C_C$ is the value of the compensation capacitors. For any given phase margin, $C_C$ depends on the magnitude of the two non-dominant poles at the sources of the pMOS cascode transistors in the op-amp and in the output current sources. These poles are inversely proportional to the intrinsic capacitances of the devices, which ultimately depends on the $f_T$ of the CMOS process. Since $g_m$ is relatively independent of $f_T$, the closed-loop bandwidth increases as $f_T$ is increased. This implies that if the V/I converter 806 were implemented in a more highly-scaled CMOS process, it could be designed to have a larger closed-loop bandwidth without increasing the current consumption. The ICRO bias current is controlled by the calibration unit as described above with respect to FIGS. 5A and 5B. The gate voltage of the pMOS current source, $V_{cal}[n]$, is the drain voltage of a diode connected pMOS transistor connected to an nMOS current-steering DAC driven by the 8-bit output of the VCO center frequency calculator in the calibration unit of FIG. 5B.

An additional benefit of the pseudo-differential architecture is that its cancellation of common-mode circuit noise eliminates the need to filter the ICRO bias voltages. Otherwise large bypass capacitors would have been required as they are in conventional continuous-time ΔΣ modulators that use current steering DACs.

As shown in FIG. 3, the calibration signal provided to the non-linearity correction 316 bypasses the V/I converter 306 so the digital background nonlinearity correction method does not cancel nonlinear distortion introduced by the V/I converter. As described above, the V/I converter is sufficiently linear that this is not a problem. Alternatively, an open loop V/I converter without an op-amp could have been used. This would have introduced significant nonlinear distortion, so it would have been necessary to modify the calibration unit 302 to inject the calibration signal into the input of a V/I converter replica. In this case, the V/I converter distortion would be cancelled along with ICRO distortion by the digital background nonlinearity correction method. One side effect of the this approach is that the dither would have to be added prior to the V/I converters in the actual signal paths. Otherwise they would be subject to distortion that the digital background nonlinearity correction method would not properly cancel. While this alternative approach is viable, it was not implemented and is not preferable because it would have dictated more complicated DACs for the calibration and dither sequences.

Dither DACs

The accuracy of the self-cancelling dither method described above with respect to FIGS. 5A and 5B depends on how well the two pseudo-differential signal paths $508\text{-}516_{1,2}$ and $508\text{-}516_{3,4}$ match and how well the two dither DACs $530_{1,2}$ and $530_{3,4}$ match. Mismatches between the pseudo-differential signal paths occur mainly among the ICROs 508, and simulations predict that such mismatches are so small as to have a negligible effect on the $\Delta\Sigma$ modulator's performance. The dither DACs 530 generate current outputs, so their matching depends on how well multiple switched current sources can be matched, which, in turn, depends on device sizing. Unfortunately, conventional current-steering DACs with sufficient matching accuracy to meet the target specifications would occupy almost half of the total circuit area of the $\Delta\Sigma$ modulator.

Figure 9:
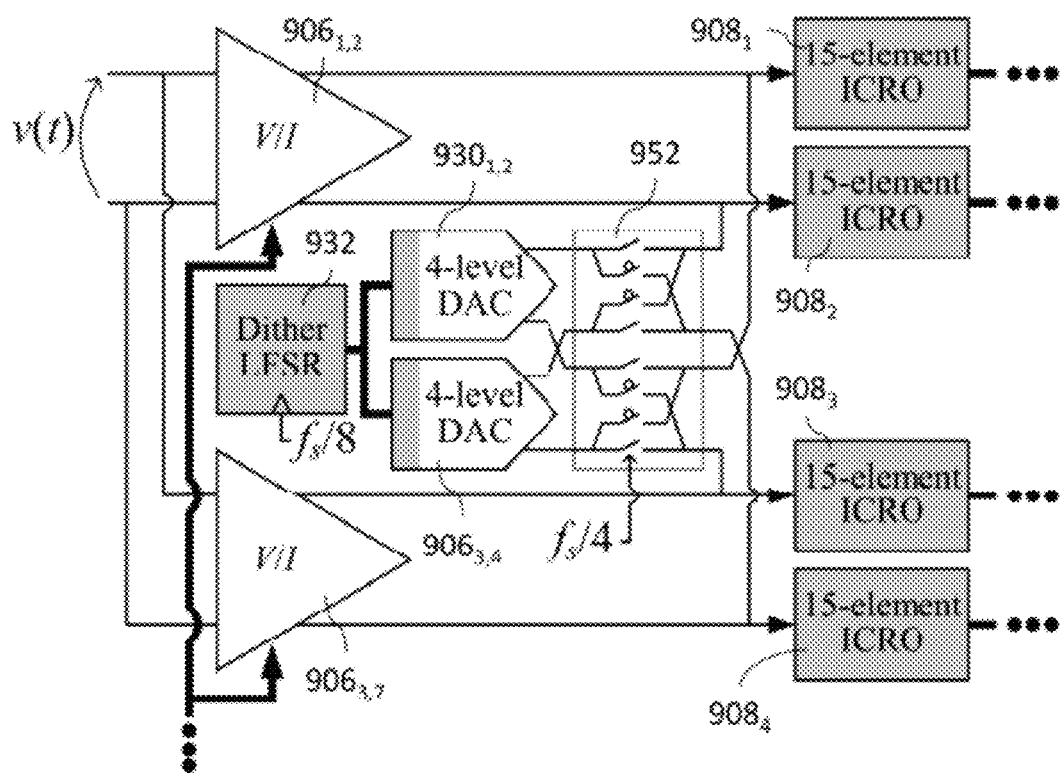
FIG. 9 illustrates a preferred dither DAC swapping method which causes the PSD of the error component in the ΔΣ modulator output arising from mismatches between the dither DACs to have a first-order highpass shape.

A solution to this problem that alleviates the matching accuracy issue is shown in FIG. 9, which uses similar reference numbers to FIGS. 5A and 5B, showing converters 906 and the ICROs 908 with subsequent portions of the signal paths omitted for simplicity. FIG. 9 also adds switching swapper cell matrix 952 to the output of dither DACs 930. This allows use a pair of very small current-steering dither DACs 930 but also suppression of the effect of their mismatch error by alternately swapping their roles at twice their update-rate with the switching matrix 952. Therefore, the outputs of each DAC 930 are connected to the ICRO 908 inputs in one of the pseudo-differential signal paths for the first half the DAC's update period, and to the ICRO inputs in the other pseudo-differential signal path for the second half of the DAC's update period. The small dither DACs 930 and the matrix 952 are trivial in size, complexity and performance when compared to traditional high-linearity feedback DACs discussed in the background. It can be verified that this causes the residual dither component in the $\Delta\Sigma$ modulator output sequence arising from DAC mismatches to have a first-order high pass power spectral density. This suppresses the error sufficiently over the $\Delta\Sigma$ modulator's signal band so as to have a negligible effect on the SNR.

A potential problem with non-return-to-zero (NRZ) current steering DACs is that parasitic capacitance at the source coupled node of the current steering cell can cause nonlinear inter-symbol interference. The DACs can avoid this problem via the dual return-to-zero (RZ) method in which a pair of RZ DACs offset from each other by half an update period are interlaced to achieve the combined effect of an NRZ DAC, See, e.g., R. Adams, K. Nguyen, K. Sweetland, "A 113 dB SNR Oversampling DAC with Segmented Noise-Shaped Scrambling," *IEEE International Solid-State Circuits Conference*, pp. 62-63, 413, February, 1998.

The architecture described above can be implemented directly as shown in FIG. 9 with the 4-level DACs implemented as RZ DACs. Alternatively, the switches in the swapper cells 952 can be built into the current steering cells of the RZ DACs. The latter approach was used in fabricating a prototype. The two implementation methods are equivalent from a signal processing point of view, but the latter results in a more compact circuit with less degradation from non-ideal circuit behavior.

Nonlinearity Correction Block

Figure 10:
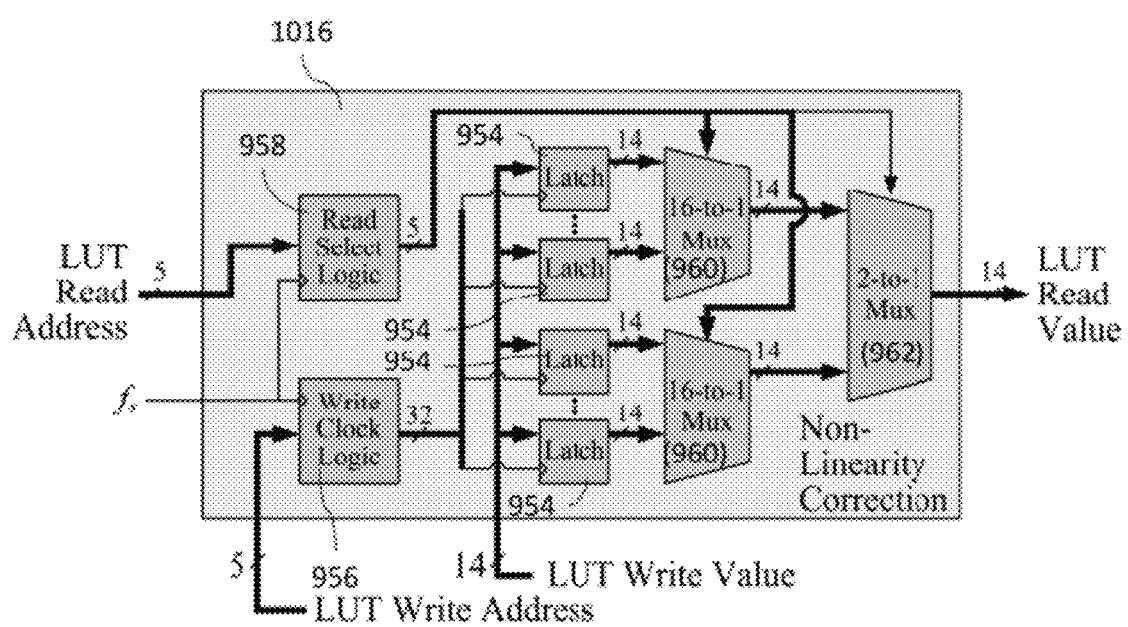
FIG. 10 illustrates a preferred nonlinearity correction block.

As described with respect to FIGS. 3-5B, each nonlinearity correction block 316, 516 is preferably a high-speed look-up table (LUT). An preferred embodiment is shown in FIG. 10 that was used in the prototype and that maps a 5-bit input sequence to a 14-bit output sequence at a rate of $f_s$, where $f_s$ can be as high as 1.152 GHz. The correction block 1016 receives as input the output of the calibration unit 302, 502. The calibration unit loads 32 14-bit registers 954 with mapping data via the LUT write address provided to write logic 956 and LUT write value lines provided to registers 954 during the first 32 $T_s$ periods once every $2^{28}T_s$. The 5-bit input sequence is used as a LUT read address via read selector logic 958. Each 5-bit value routes the 14-bit output from the corresponding register to the output via multiplexers 960 and 962.

Circuit Noise Sources

The lowpass ring oscillator phase noise is subjected to the highpass transfer function of the $1-z^{-1}$ blocks 514, so the resulting contribution to the output sequence in the signal band is nearly white noise. Simulations indicate that in each $\Delta\Sigma$ modulator the V/I converter resistors, V/I converter op-amps, VCO bias current sources, and ICROs together contribute 10 nV/$\sqrt{\text{Hz}}$, 9 nV/$\sqrt{\text{Hz}}$, 10 nV/$\sqrt{\text{Hz}}$, and 9 nV/$\sqrt{\text{Hz}}$, respectively, of noise referred to the input. For a full-scale sinusoidal input signal (800 mV differential peak-to-peak) and a signal bandwidth of 18 MHz, the resulting SNR from thermal noise only is 77 dB. It follows from (25) that for this signal bandwidth $SQNR_{max}$=76 dB, so the expected peak SNR from thermal and quantization noise together is 73 dB.

The prototype $\Delta\Sigma$ modulator constructed according to FIGS. 5A, 5B, and 7-9 is much less sensitive to clock jitter than conventional $\Delta\Sigma$ modulators with continuous-time feedback DACs because it does not contain feedback DACs. Jitter-induced ring sampler error is suppressed in the signal band because it is subjected to first-order highpass shaping by the subsequent $1-z^{-1}$ blocks 514, and jitter-induced errors from the dither DACs 530 (see also 930 in FIG. 9) largely cancel along with the dither when the outputs of the pseudo-differential signal paths are added. In contrast, jitter-induced error from the feedback DACs in the first stage of a conventional continuous-time $\Delta\Sigma$ modulator is neither highpass shaped nor cancelled. Most of the published wideband continuous-time $\Delta\Sigma$ modulators use current-steering feedback DACs whose pulse widths and pulse positions are both subject to clock jitter. The jitter mixes high-frequency quantization noise into the signal band, so a very low-jitter clock is necessary so as not to degrade the noise floor of the signal band. See, e.g., Mitteregger, C. Ebner, S. Mechnig, T. Blon, C. Holugigue, E. Romani, "A 20-mW 640-MHz CMOS Continuous-Time $\Delta\Sigma$ ADC With 20-MHz Signal Bandwidth, 80-dB Dynamic Range and 12-bit ENOB," *IEEE Journal of Solid-State Circuits*, vol. 41, no. 12, pp. 2641-2649, December 2006.

Measurement Results

The prototype IC was fabricated in the TSMC 65 nm LP process with the deep nWell option and both 1.2V single-oxide devices and 2.5V dual-oxide devices, but without the MiM capacitor option. All pads have ESD protection circuitry. The IC was packaged in a 64-pin LFCSP package.

Each IC fabricated contains two ΔΣ modulators with a combined active area of 0.14 mm². The calibration unit area is 0.06 mm². The signal converter, i.e., the portion of each ΔΣ modulator not including the calibration unit, has an area of 0.04 mm². A single calibration unit is shared by the two ΔΣ modulators, so the area per ΔΣ modulator is 0.07 mm².

All components of both ΔΣ modulators are implemented on-chip is except for the $f_s/2^{28}$-rate coefficient calculation block within the calibration unit's nonlinearity coefficient calculator block. A schedule problem just prior to tapeout prevented on-time completion of this block so it was implemented off-chip. It has since been laid out for a new version of the IC and found to increase the overall area by 0.004 mm² with negligible incremental power consumption because of its low rate of operation.

A printed circuit test board was used to evaluate the IC mounted on a socket. The test board includes input signal conditioning circuitry, clock conditioning circuitry, and an FPGA for ADC data capture and serial port communication. The input conditioning circuitry uses a transformer to convert the single-ended output of a laboratory signal generator into a differential input signal for the IC. The clock conditioning circuitry also uses a transformer. It converts the single-ended output of a laboratory signal generator to a differential clock signal for the IC. Two power supplies provide the 1.2 and 2.5 V power supplies for the IC. The V/I converters operate from the 2.5 V supply, and all other blocks on the IC operate from the 1.2 V supply.

Measurements were performed with a clock frequency, $f_s$, ranging from 500 MHz to 1.152 GHz. Single-tone and two-tone input signals were generated by high-quality laboratory signal generators and were passed through passive narrow-band band-pass filters to suppress noise and distortion from the signal generators. Each output spectrum presented below was obtained by averaging 4 length-16384 periodograms from non-overlapping segments of ΔΣ modulator output data, and the SNR and SNDR values were calculated from the resulting spectra via the technique presented in B. Boser, K.-P. Karmann, H. Martin, B. Wooley, "Simulating and Testing Oversampled Analog-to-Digital Converters", IEEE Transactions on Computer Aided Design, Vol. 7, No. 6, pp. 668-674, June 1988. Both ΔΣ modulators on five copies of the IC were tested with no noticeable performance differences.

Figure 11:
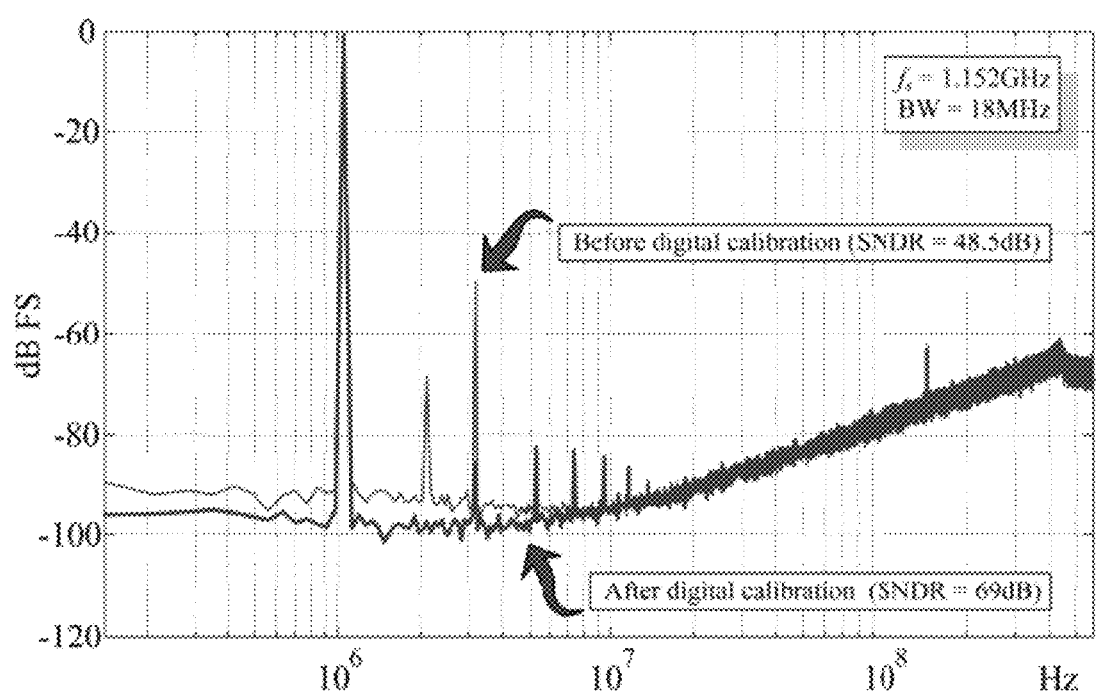
FIG. 11 illustrates representative measured PSD plots of the experimental ΔΣ modulator output before and after digital background calibration (initial convergence time of digital calibration unit is 233 ms)

FIG. 11 shows representative measured output spectra of the ΔΣ modulator for a 0 dBFS, 1 MHz single-tone input signal with $f_s$=1.152 GHz, both with and without digital background calibration enabled. Without calibration, the SNDR over the 18 MHz signal band is only 48.5 dB because of harmonic distortion and a high noise floor. The high noise floor is the result of common-mode to differential-mode conversion of common-mode thermal noise via the strong second-order distortion introduced by the VCOs as discussed above. With calibration enabled, the SNDR improves to 69 dB. In particular, the second-order term cancels extremely well.

Figure 12A:
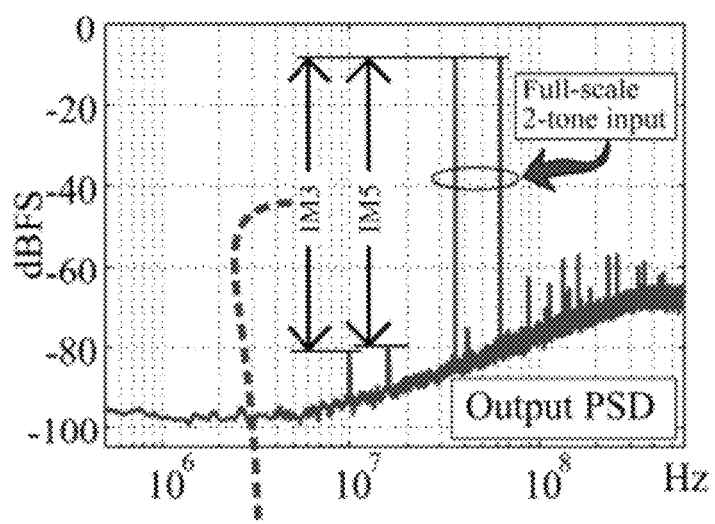
FIGS. 12A and 12B are plots of the measured output PSD for a two-tone out-of-band input signal (FIG. 12A) and intermodulation distortion (FIG. 12B for the experimental ΔΣ modulator run with $f_s$=1.152 GHz.
Figure 12B:
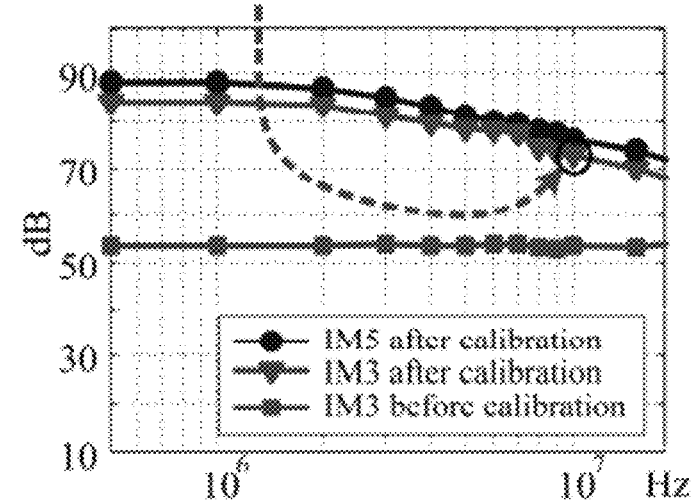

The measured inter-modulation performance of the ΔΣ modulator with $f_s$=1.152 GHz is shown in FIGS. 12A and 12B. FIG. 12A shows the measured spectrum of the ΔΣ modulator output for a two-tone out-of-band input signal, and the corresponding signal to third-order and fifth-order inter-modulation distortion ratios, denoted as IM3 and IM5, respectively. Measurements indicate that the IM3 and IM5 values depend mainly on the difference in frequency between the two input tones, but not on where in the 576 MHz Nyquist band the two input tones are placed.

FIG. 12B shows the measured IM3 and IM5 values as a function of the frequencies at which they occur within the signal band. Each value was measured by injecting a full-scale, out-of-band, two-tone input signal into the ΔΣ modulator and measuring the IM3 and IM5 values corresponding to inter-modulation terms within the 18 MHz signal band. For example, the IM3 value measured from the top plot corresponds to the circled data point in FIG. 12B. The IM3 values before and after digital calibration are shown. The IM5 values were not measurably affected by digital calibration, so only the IM5 values after calibration are shown.

The low-frequency IM3 of better than 83 dB suggests that the calibration unit does a very good job of measuring third-order distortion for low-frequency inter-modulation products (even when the input tones are well above the signal bandwidth). However, the reduction in IM3 values for inter-modulation products near the high end of the 18 MHz signal band indicate that the third-order distortion coefficient is somewhat frequency dependent. Simulations suggest that this frequency dependence is caused by nonlinear phase shift at the output nodes of the V/I converters. Nevertheless, throughout the maximum signal bandwidth of 18 MHz, the IM3 product is greater than 69 dB.

Figure 13A:
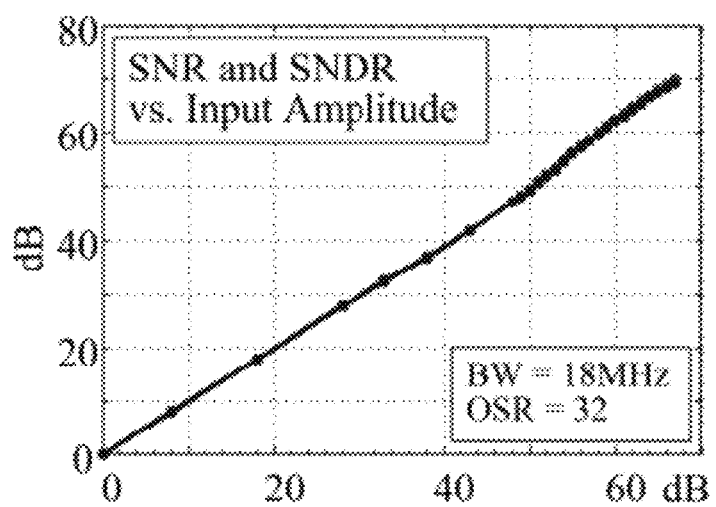
FIGS. 13A and 13B are plots of the measured SNR and SNDR for an 18 MHz signal band (FIG. 13A) bandwidth 9 MHz signal-band (FIG. 13B) for the experimental ΔΣ modulator run with $f_s$=1.152 GHz.
Figure 13B:
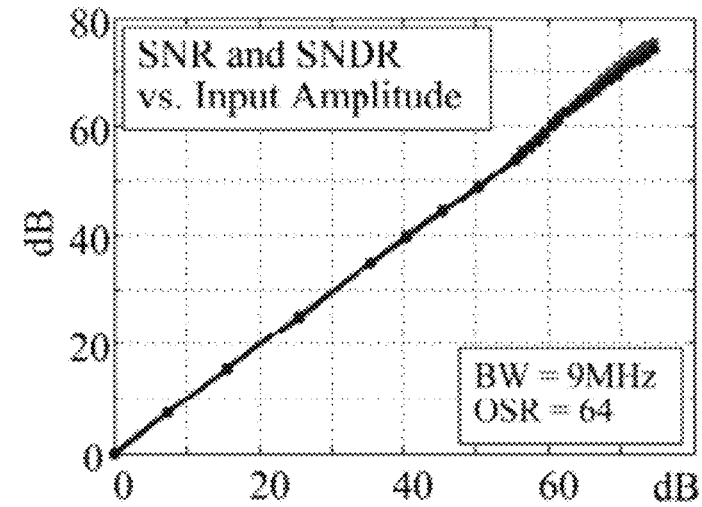

FIGS. 13A and 13B are plots of the SNR and SNDR versus input amplitude for the ΔΣ modulator measured over an 18 MHz signal bandwidth and a 9 MHz signal bandwidth with $f_s$=1.152 GHz. These signal bandwidths correspond to oversampling ratios of 32 and 64, respectively. The SNR and SNDR for a peak input signal with an oversampling ratio 32 are 70 dB and 69 dB, respectively; and those for an oversampling ratio of 64 are 76 dB and 73 dB. This suggests that quantization noise as opposed to thermal and 1/f noise limits performance at the lower oversampling ratio.

A peak SNR of 73 dB was expected over a signal bandwidth of 18 MHz, but as mentioned above the measured SNR over this bandwidth is 70 dB. The authors believe that this discrepancy is caused by non-uniform quantization effects arising from an asymmetric layout of the ICROs. Simulations with parasitics extracted from the layout indicate that this increases the quantization noise by roughly 3 dB and reduces the no-overload range of the ΔΣ modulator by roughly 0.5 dB.

Figure 14:
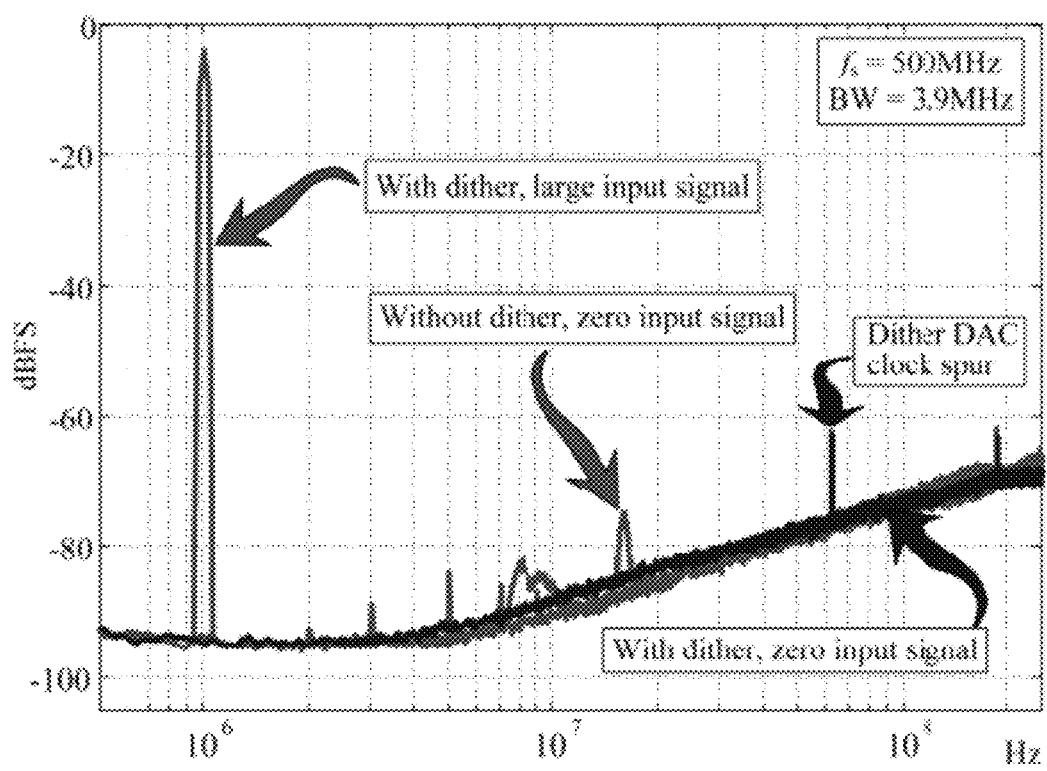
FIG. 14 shows representative measured PSD plots of the experimental ΔΣ modulator output with and without dither.

FIG. 14 shows representative measured output spectra of the ΔΣ modulator with $f_s$ reduced to 500 MHz for a large input signal with the dither DACs 530/930 enabled, and for a zero input signal both with and without the dither DACs enabled. The spectrum corresponding to the zero input signal with the dither DACs disabled has significant spurious content, as expected. The spectrum corresponding to the zero input signal with the dither DACs enabled indicates that the quantization noise is well-behaved and the dither cancellation process is effective because the noise floor over the signal band does not change as a result of enabling the dither DACs. Clock feed-through from the dither DACs is visible at $f_s/8$, but it lies well outside the signal bandwidth. Similar results to those shown in FIG. 14 occur when $f_s$ is varied between 500 MHz and 1.152 GHz.

Measured results from the prototype IC are summarized relative to comparable state-of-the-art ΔΣ modulators in Table 1. As indicated in the table, the performance of the ΔΣ modulator is comparable to the state-of-the-art, but uses significantly less circuit area.

TABLE 1

| | Present Invention | | | | | | | [2] | [3] | [4] | [5] |
|---|---|---|---|---|---|---|---|---|---|---|---|
| Area (mm²) | 0.07 | | | | | | | 0.7 | 1.5 | 0.45 | 0.15 |
| Process | 65 nm | | | | | | | 180 nm | 130 nm | 130 nm | 65 nm |
| $f_s$ (MHz) | 1152† | | | | | | 500 | 640 | 640 | 900 | 250 |
| OSR | 32 | | | 64 | | 128 | 64 | 32 | 16 | 22.5 | 12.5 |
| BW (MHz) | 18 | | | 9 | | 4.5 | 3.9 | 10 | 20 | 20 | 20 |
| $f_{in}$ (MHz) | 1 | 2.3 | 5 | 1 | 2.3 | 1 | 1 | 2.4 | 3.68 | 2 | 3.9 |
| SNR (dB) | 70 | 70 | 70 | 76 | 76 | 80 | 71.5 | 84 | 76 | 81.2 | 62 |
| SNDR (dB) | 69 | 67.3 | 67* | 73 | 72* | 77.8* | 71* | 82 | 74 | 78.1 | 60 |
| Power (mW) | 17‡ | 17 | 17 | 17 | 17 | 17 | 8 | 100 | 20 | 87 | 10.5 |
| FOM** | 159 | 157.5 | 157* | 160 | 159* | 162* | 157.9* | 162 | 164 | 161.7 | 152.7 |

†Maximum frequency limited by test board FPGA used for data acquisition
‡Analog (V/I circuits and DACs): 5 mW, Digital: 12 mW
*Worst-case value over stated BW (SNDR remains unchanged or improves at higher $f_{in}$ values)
**FOM ≡ SNDR + $10\log_{10}$(BW/Power)

[2] W. Yang, W. Schofield, H. Shibata, S. Korrapati, A. Shaikh, N. Abaskharoun, D. Ribner, "A 100 mW 10 MHz-BW CT ΔΣ Modulator with 87 dB DR and 91 dBc IMD", *IEEE International Solid-State Circuits Conference*, pp. 498-499, February 2008.
[3] G. Mitteregger, C. Ebner, S. Mechnig, T. Blon, C. Holugigue, E. Romani, "A 20-mW 640-MHz CMOS Continuous-Time ΔΣ ADC With 20-MHz Signal Bandwidth, 80-dB Dynamic Range and 12-bit ENOB," *IEEE Journal of Solid-State Circuits*, vol. 41, no. 12, pp. 2641-2649, December 2006.
[4] M. Park, M. Perrott, "A 0.13 μm CMOS 78 dB SNDR 87 mW 20 MHz BW CT ΔΣ ADC with VCO-Based Integrator and Quantizer," *IEEE International Solid-State Circuits Conference*, pp. 170-171, February 2009.
[5] V. Dhanasekaran, M. Gambhir, M. M. Elsayed, E. Sánchez-Sinencio, J. Silva-Martinez, C. Mishra, L. Chen, E. Pankratz, "A 20 mHz BW 68 dB DR CT ΔΣ ADC Based on a Multi-Bit Time-Domain Quantizer and Feedback Element," *IEEE International Solid-State Circuits Conference*, pp. 174-175, February 2009.

The ΔΣ modulator's performance depends mainly on the digital circuit speed of the CMOS process. As described above, quantization noise, which limits the implemented ΔΣ modulator's performance at low oversampling ratios, scales with the minimum delay through a ring VCO inverter. The V/I converter accounts for less than a third of the total power dissipation, and as described in Section IV-B its bandwidth should increase as $f_T$ increases. Therefore, unlike conventional analog ΔΣ modulators, the ΔΣ modulator architecture described in this description is likely to yield even better results when implemented in more highly scaled CMOS technology.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A continuous-time delta-sigma modulator for analog-to-digital conversion, comprising:
   an actual signal path including a converter that drives a ring voltage controlled oscillator, a ring sampler for sampling said voltage controlled oscillator, a phase decoder that maps values from the ring sampler into a phase number, a digital differentiator that differentiates the phase number and a nonlinearity corrector providing a corrected signal path output; and
   a calibration circuit including a replica signal path, the calibration circuit measuring a voltage controlled oscillator center frequency of said replica signal path, wherein said replica signal path is corrected with calibration sequences of independent, zero-mean, pseudo-random sequences, said calibration circuit using said center frequency to adjust current of said converter in said signal path, said calibration circuit further providing correction data generated from an output of said replica signal path to said nonlinearity corrector.

2. The modulator of claim 1, wherein said calibration circuit drives an output of said replica signal path to have zero mean and a sequence based upon said output of said replica signal path is used to generate said correction data.

3. The modulator of claim 1, wherein said nonlinearity corrector maps its input onto said corrected signal path output such that said corrected signal path output does not contain any ring voltage controlled oscillator induced second-order or third-order distortion terms.

4. The modulator of claim 1, wherein said actual signal path comprises a pseudo differential path having a first and second paths each having a corresponding ring voltage controlled oscillator, a ring sampler for sampling said voltage controlled oscillator, a phase decoder that maps values from the ring sampler into a phase number, a digital differentiator that differentiates the phase number and a nonlinearity corrector providing a corrected signal path output, and wherein said converter in said actual signal path comprises a differential converter that drives each of said first and second paths.

5. The modulator of claim 4, wherein said actual signal path comprises dual pseudo differential signal paths, the modulator further comprising a dither generator that adds dither to one of the dual pseudo differential signal paths and subtracts it from the other of the dual pseudo differential signal paths.

6. The modulator of claim 5, wherein said dither generator comprises generators a pseudo random white dither sequence that is provided as a current separately to outputs of the converters in said dual pseudo differential signal paths via separate dither digital to analog converters.

7. The modulator of claim 6, further comprising a swapper switching matrix that switches outputs of said dither digital to analog converters between said dual pseudo differential paths.

8. The modulator of claim 7, wherein said swapper switching matrix switches at a rate that is twice the update rate of said digital to analog converters.

9. The modulator of claim 1, wherein said ring voltage controlled oscillator includes dual negative and positive input and output inverters, and said phase decoder decodes a transition for each inverter such that each inverter is defined to be in positive transition when its positive input voltage and positive output voltage are less than and greater than a digital logic threshold, respectively, and that each inverter is defined to be in negative transition when its negative input voltage and negative output voltage are less than and greater than the digital logic threshold, respectively.

10. The modulator of claim 1, wherein said nonlinearity corrector comprises a high speed look up table that is loaded with mapping data from the calibration circuit.

11. A continuous-time delta-sigma modulator for analog-to-digital conversion, comprising:
   a signal path generating including a ring voltage controlled oscillator driven by an analog input signal, the signal path producing digital values by sampling the ring voltage controlled oscillator;
   a calibration circuit that measures nonlinear distortion coefficients in a replica of said signal path; and
   a nonlinearity corrector correcting said digital values based upon said nonlinear distortion coefficients.

12. The modulator of claim 11, wherein said nonlinearity corrector eliminates ring voltage controlled oscillator induced second-order or third-order distortion terms.

13. The modulator of claim 11, wherein said signal path comprises a pseudo differential path having a first and second paths each having a corresponding ring voltage controlled oscillator, a ring sampler for sampling said voltage controlled oscillator, a phase decoder that maps values from the ring sampler into a phase number, a digital differentiator that differentiates the phase number and a nonlinearity corrector providing a corrected signal path output, and wherein said converter in said signal path comprises a differential converter that drives each of said first and second paths.

14. The modulator of claim 13, wherein said signal path comprises dual pseudo differential signal paths, the modulator further comprising a dither generator that adds dither to one of the dual pseudo differential signal paths and subtracts it from the other of the dual pseudo differential signal paths.

15. The modulator of claim 14, wherein said dither generator comprises generators a pseudo random white dither sequence that is provided as a current separately to outputs of the converters in said dual pseudo differential signal paths via separate dither digital to analog converters.

16. A continuous-time delta-sigma modulator for analog-to-digital conversion, comprising:
   a ring sampler that samples said ring voltage controlled oscillator;
   a phase decoder that maps digital values sampled by the ring sample onto a phase number that represents the phase of the ring voltage controlled oscillator as a quantized value to a fraction of cycle of the ring voltage controlled oscillator; and
   a digital background calibration circuit that conducts 1) digital background cancellation of ring voltage controlled oscillator-induced second-order and third-order distortion and 2) digital background tuning of the ring voltage controlled oscillator's center frequency to the $\Delta\Sigma$ modulator's sample rate, $f_{s*}$, wherein the digital background cancellation is conducted in combination with a pseudo-differential architecture and the digital background tuning centers the input range of the $\Delta\Sigma$ modulator about the midscale input voltage to maximize dynamic range, and thereby provide reconfigurability by automatically retuning the ring voltage controlled oscillator's center frequency whenever $f_s$ is changed.

17. A method for analog-to-digital signal conversion, the method comprising:
   driving a ring oscillator with a current derived from an analog input signal;
   phase converting a signal determined from an output of the ring oscillator and generating an output signal;
   determining nonlinear distortion introduced by said ring oscillator with a replica path including a replica of said ring oscillator and said phase converter; and
   correcting said output signal based upon said nonlinear distortion determined in said step of determining.

\* \* \* \* \*

UNITED STATES PATENT AND TRADEMARK OFFICE
CERTIFICATE OF CORRECTION

PATENT NO. : 8,542,138 B2  
APPLICATION NO. : 13/359701  
DATED : September 24, 2013  
INVENTOR(S) : Galton et al.

Page 1 of 1

It is certified that error appears in the above-identified patent and that said Letters Patent is hereby corrected as shown below:

In the Specification:

| | |
|---|---|
| Col. 17, line 3 | After "effect of", please delete "the". |
| Col. 17, line 35 | After "allows" please delete "use" and insert --using-- therefor. |
| Col. 17, line 41 | After "first half", please insert --of--. |
| Col. 18, line 19 | After "32$T_s$,", please insert --clock--. |

Signed and Sealed this  
Sixth Day of May, 2014

Michelle K. Lee  
*Deputy Director of the United States Patent and Trademark Office*